US006321362B1

(12) United States Patent
Conn et al.

(10) Patent No.: US 6,321,362 B1
(45) Date of Patent: Nov. 20, 2001

(54) METHOD OF REFORMULATING STATIC CIRCUIT OPTIMIZATION PROBLEMS FOR REDUCED SIZE, DEGENERACY AND REDUNDANCY

(75) Inventors: Andrew R. Conn, Mount Vernon; Chandramouli Visweswariah, Croton-on-Hudson, both of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/286,758

(22) Filed: Apr. 6, 1999

(51) Int. Cl.[7] .................................................. G06F 17/50
(52) U.S. Cl. ........................................ 716/2; 716/6
(58) Field of Search .............................. 716/2, 6

(56) References Cited

U.S. PATENT DOCUMENTS

| | | | |
|---|---|---|---|
| 5,657,239 | * | 8/1997 | Grodstein et al. ................. 716/6 |
| 6,212,666 | * | 4/2001 | Gohl et al. ........................ 716/6 |
| 6,253,365 | * | 6/2001 | Baldwin ............................ 716/2 |

OTHER PUBLICATIONS

J. A. Bondy and U.S.R. Murty, Graph Theory with Applications, Title page, Publication Data Page, pp. 17–18, 32–33 (London, MacMillan 1978). (no date).

* cited by examiner

*Primary Examiner*—Trong Phan
(74) *Attorney, Agent, or Firm*—Paul J. Otterstedt

(57) ABSTRACT

A method of pruning an initial timing graph for static optimization of a digital circuit includes examining a first group of nodes, which in turn include at least a first one of the nodes in the initial timing graph, to determine whether every node in the first group is prunable. The method further includes pruning the first group by pruning every node therein, if every node therein is prunable, and if the pruning would be beneficial. Furthermore, the method includes repeating the examining and pruning steps for a substantial number of additional groups of nodes, so as to create a pruned timing graph having enhanced numerical qualities and/or compactness compared to an initial timing graph. The pruning can be conducted on groups of more than one node at a time, or on only individual nodes at one time. Reduced size, and the benefits thereof, can be determined by a comparison of the number of nodes and number of directed edges before pruning, with the number of nodes and the number of directed edges after pruning, by summing the quantities before pruning and comparing the sum to the summed quantities after pruning, with or without weighting. Preferably, multistep pruning can be employed to first perform all pruning operations with a gain of a certain value, and to continue for gains of lower values. In an alternative method, an explicit representation of the problem as a timing graph is not employed, but the circuit optimization problem is restated in an analogous manner by pruning arrival times and manipulating constraints.

32 Claims, 14 Drawing Sheets

METHOD OF REFORMULATING STATIC CIRCUIT OPTIMIZATION PROBLEMS FOR REDUCED SIZE, DEGENERACY AND REDUNDANCY

BACKGROUND OF THE INVENTION

1. Field of the Invention

The present invention relates to computer-aided design of digital electronic circuits, and more particularly relates to a method of reformulating static circuit optimization problems in order to reduce size, degeneracy, and/or redundancy.

2. Brief Description of the Prior Art

As digital electronic circuits increase in size and complexity, automatic optimization of performance-critical designs increases in importance. Such automatic optimization can lead to better circuits and enhanced productivity. Static circuit optimization implies the determination of optimal transistor and wire sizes, on a static timing basis, while simultaneously taking into account all paths through the logic. The advantages of static optimization include increased designer productivity, since an optimal circuit is automatically determined; higher quality circuits, that is, faster, smaller, and/or lower power consumption; and the fact that all paths through the logic are simultaneously considered.

Reference should be had to FIG. 1, which depicts the flow of a typical prior art circuit optimization method. As shown at Block 102, a description of the circuit (or netlist) which is to be optimized can initially be prepared. "Netlist" is a generic term for a file containing a description of a circuit. The circuit description can then be read, as in Block 104, and a timing graph can be created based on the circuit description which has been read, as shown in Block 106. Timing constraints can then be formulated which correspond to the circuit description, as shown at Block 108, and then additional constraints and objective functions can be added as necessary, per Block 109. Finally, the circuit can be optimized as per Block 110.

Block 106 is optional, as a timing graph need not always be created, instead, the timing constraints associated with the problem statement can be formulated directly. In this case, the constraints formulated in Block 108 will correspond to the problem statement. When a timing graph is employed, per Block 106, Block 108 can include formulating constraints which correspond to the timing graph. Any additional constraints and objective functions which are necessary can be added per Block 109, as above.

One exemplary method of static circuit optimization is disclosed in U.S. patent application Ser. No. 950,782 of Strenski, filed Oct. 15, 1997, the disclosure of which is expressly incorporated herein by reference. Although the Strenski method is advantageous, and achieves the benefits set forth above, there are still problems with the Strenski method, and indeed, with all known prior art methods of circuit optimization. Chief among these is computational complexity. Large digital circuits, with many components, can result in extremely complex optimization problems which may require many hours of CPU time to solve. Accordingly, it would be highly desirable to improve prior art methods.

Further, in prior art methods, the formulation of the optimization problem suffers from numerical disadvantages such as redundancy and degeneracy. In a degenerate case, a LaGrange multiplier associated with an active constraint is zero. In a redundant case, removal of a constraint without any other manipulation doesn't change the problem. All active redundant constraints give rise to a degenerate problem. However, there are degenerate problems without redundant constraints. From an optimization perspective, these types of problems often have multiple equivalent solutions and are relatively difficult to solve.

In view of the foregoing, there is a need in the prior art for a method of reformulating static optimization problems for digital circuits which can reduce the size of problem, as well as potentially reducing degeneracy and redundancy.

SUMMARY OF THE INVENTION

The present invention, which addresses the needs identified in the prior art, provides a method of pruning an initial timing graph for static optimization of a digital circuit. The method is employed when a timing graph is constructed for the digital circuit which it is desired to optimize. The timing graph has a plurality of nodes corresponding to arrival times of signals in the digital circuit, and also has a plurality of directed edges corresponding to propagate segments in the digital circuit. Those of the edges which are directed into a given node are referred to as fan-ins for that node, and are connected to associated fan-in nodes. Similarly, those of the edges which are directed out of a given node are referred to as fan-outs for that node and are connected to associated fan-out nodes. The method includes the steps of examining a first group of the nodes; pruning the first group of nodes; and repeating the examining and pruning steps for a substantial number of additional groups of nodes. More specifically, in the examining step, the first group of nodes includes at least a first one of the nodes in the initial timing graph, and the examination is conducted in order to determine whether every node of the first group is prunable. In the pruning step, the pruning of the first group is conducted by pruning every node in the first group, if every node of the first group is indeed prunable, and if the pruning would be beneficial. In the step of repeating the examining and pruning steps, the repetition is typically conducted for a substantial number of additional groups, each of which includes at least one additional node, so as to create a pruned timing graph which has enhanced qualities with respect to the initial timing graph. The enhanced qualities include at least one of enhanced numerical qualities, such as reduced redundancy and degeneracy, as well as compactness, i.e., reduced size.

The invention also includes a program storage device readable by machine, which tangibly embodies a program of instructions executable by the machine to perform the method steps for pruning an initial timing graph, as just described.

Yet further, the present invention includes a method for static optimization of a digital circuit, with the method including the steps of creating a description of the digital circuit; creating an initial timing graph based on the description of the digital circuit, the timing graph being as described previously; pruning the initial timing graph as just described; listing timing constraints corresponding to the pruned graph; adding additional constraints and objective functions as necessary; and then optimizing the digital circuit based on the timing constraints corresponding to the pruned graph. The present invention further includes a digital circuit which has been optimized by the process just described.

The present invention yet further provides an alternative method for problem restatement, similar to the method of pruning described above, but wherein the arrival times and constraints are not explicitly represented in timing graph form. Accordingly, this alternative method provides a method of restating an initial statement of a circuit optimization problem for static optimization of a digital circuit. The problem statement has a plurality of arrival times of signals in the digital circuit and a plurality of constraints. The method includes the steps of examining all those of the constraints in which at least a first group of the arrival times occur; manipulating the constraints; and then repeating the examining and manipulating steps for a substantial number of additional arrival time groups, so as to create a pruned restatement of the optimization problem.

More specifically, in the examining step, all of those constraints in which at least a first group of the arrival times occur are examined to determine if the constraints in which the first group of arrival times occur can be algebraically manipulated in a manner corresponding to pruning of the first group of arrival times. In the manipulating step, the constraints in which the first group of arrival times occur are manipulated if such such manipulation is possible so as to prune the first group of arrival times, and if such manipulation would also be beneficial. In the repeating step, the repetition of the examining and manipulating steps is conducted for a substantial number of additional arrival time groups so as to create the pruned restatement of the optimization problem, which has enhanced qualities with respect to the initial statement of the optimization problem.

The enhanced qualities include at least one of numerical qualities and compactness, as discussed above.

The present invention further includes a program storage device readable by machine, tangibly embodying a program of instructions executable by the machine to perform the method steps just described for restating an initial statement of a circuit optimization problem for static optimization of a digital circuit.

Yet further, the present invention includes a method for static optimization of a digital circuit including the steps of creating a description of the digital circuit; creating an initial problem statement of the type just described, based on the description of the digital circuit restating the initial problem statement in the fashion just described; listing timing constraints corresponding to the restated problem statement; adding additional constraints and objective functions as necessary, and then statically optimizing the digital circuit based on the timing constraints corresponding to the restated problem statement. Yet further, the present invention includes a digital circuit optimized by the process just described.

These and other features and advantages of the present invention will be appreciated by reading the following specification, taken in conjunction with the accompanying drawings, and the scope of the invention will be set forth in the appended claims.

DETAILED DESCRIPTION OF THE INVENTION

Figure 1:
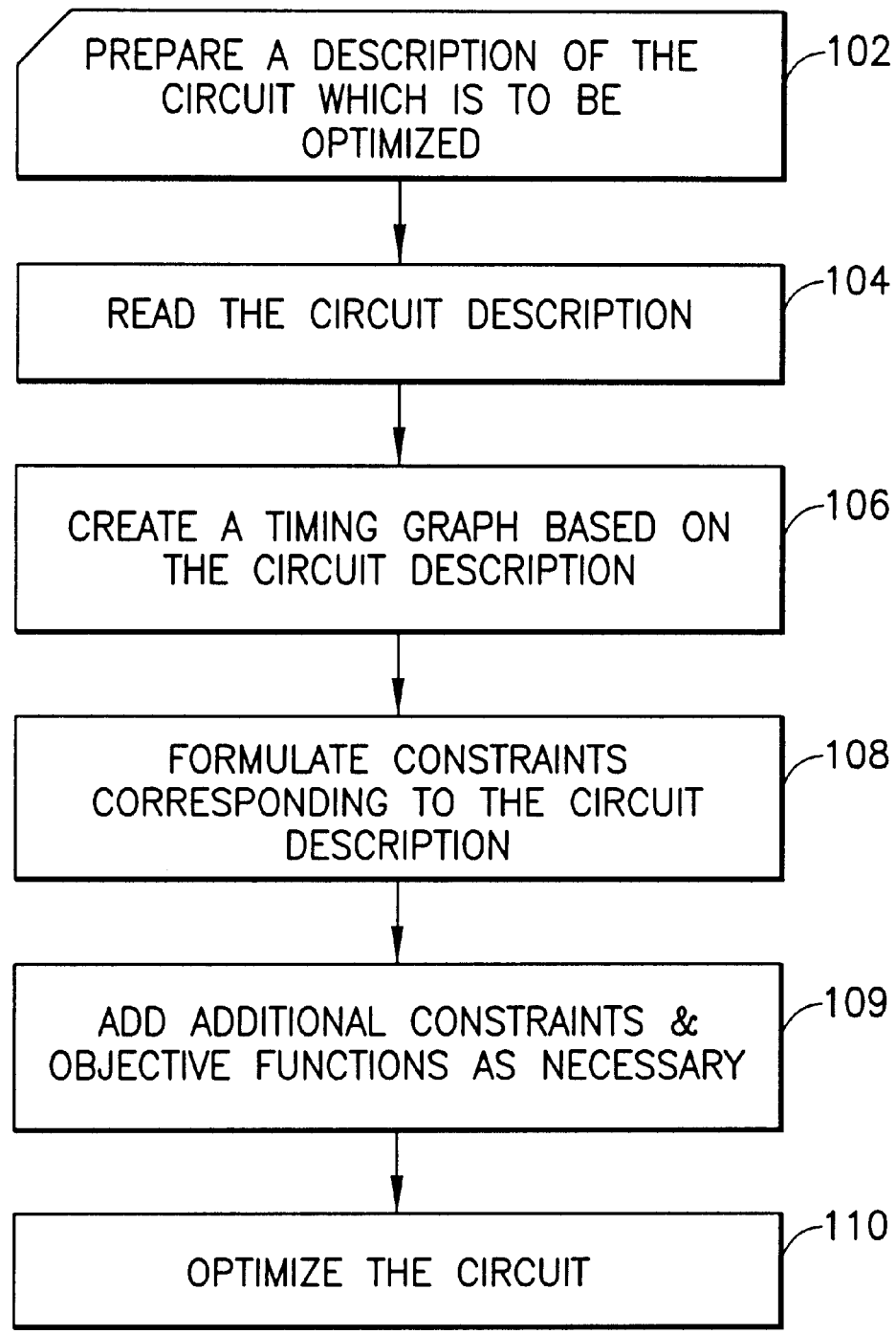
FIG. 1 is a flow chart of a prior art method of static circuit optimization.
Figure 2:
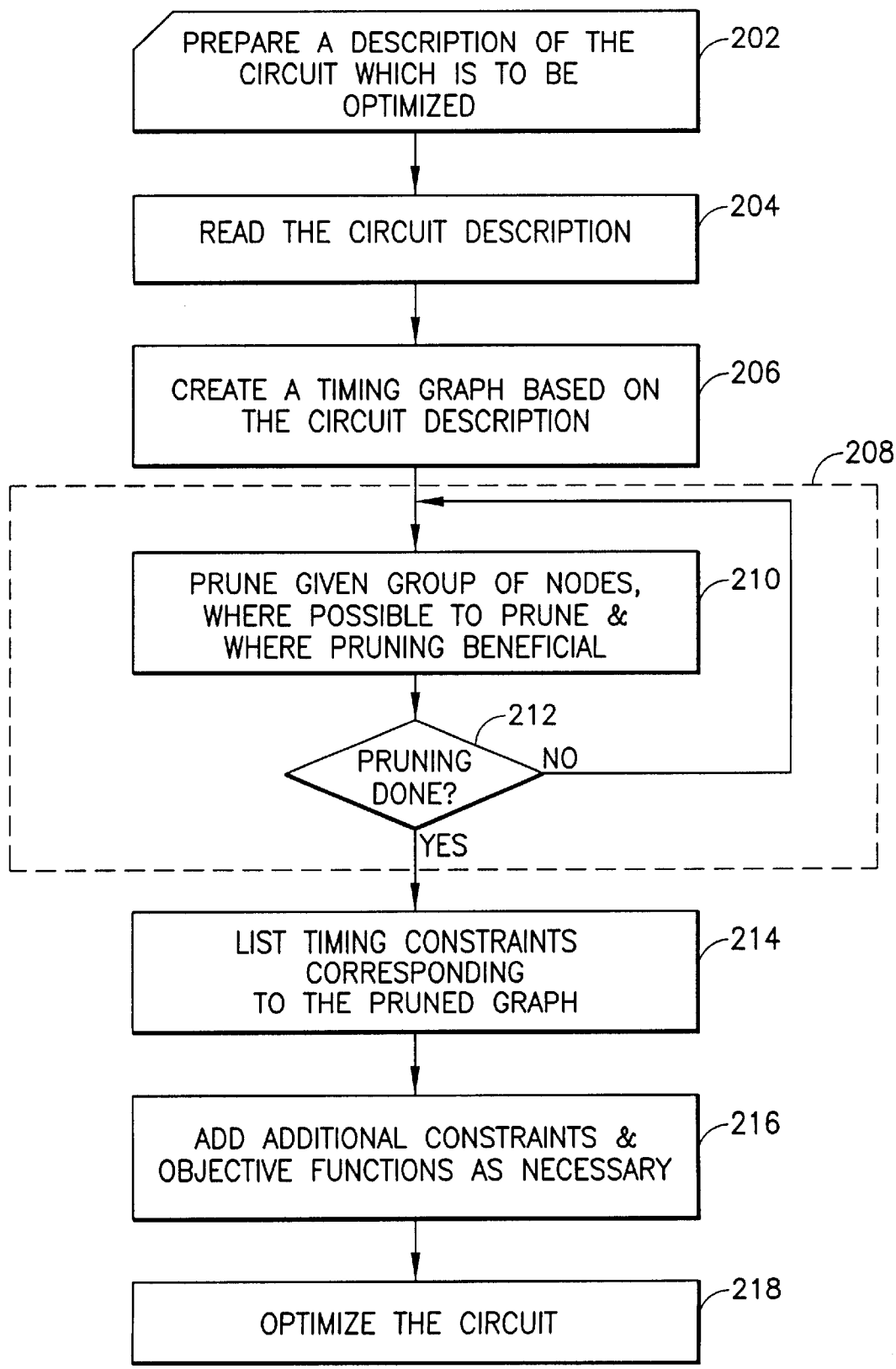
FIG. 2 is a flow chart of circuit optimization in accordance with the present invention, employing a timing graph representation.

Reference should now be had to FIG. 2 for description of a method for static optimization of a digital circuit in accordance with the present invention. Initially, a description of the circuit (or netlist) which is to be optimized can be prepared, per Block 202. The circuit description can then be read in, as per Block 204. A timing graph can then be created based on the circuit description, as in Block 206. This will be an initial timing graph, and will be based on the aforementioned description of the digital circuit. The initial timing graph will have a plurality of nodes corresponding to arrival times of signals in the digital circuit and a plurality of directed edges corresponding to propagate segments in the digital circuit. Those of the edges directed into a given node are referred to as fan-ins for that node and are connected to associated fan-in nodes. Those of the edges directed out of the given node are referred to as fan-outs for that node and are connected to associated fan-out nodes. Further illustration of these points will be provided below. It will be appreciated that Blocks 202, 204 and 206 are similar to the corresponding Blocks 102, 104 and 106 for the prior art method shown in FIG. 1. The method of the present invention adds the step of pruning the initial timing graph, as indicated at Block 208. A given group of nodes can be pruned, where the pruning is possible and where the pruning is also beneficial, as indicated at Block 210. The group can contain one or more nodes. As indicated at decision Block 212, pruning can continue until it is finished. Typically, a substantial number of groups of nodes can be pruned, indeed, it is desirable that all nodes be examined to see if they can be pruned, and that all prunable nodes be pruned if beneficial. Further illustration of specific pruning steps employed in the present invention will be set forth below. The pruning provides enhanced qualities such as a reduction in size of the problem (compactness), or enhanced numerical qualities, such as reduced redundancy and degeneracy.

Additional steps in the method include the listing of timing constraints corresponding to the pruned graph, as shown in Block 214, and the addition of additional constraints and objective functions as necessary, as shown at Block 216. Additional constraints and objective functions include slew constraints, slew limits, area constraints, input loading constraints and minimization of the worst output arrival time. The foregoing list is merely exemplary, and other items, e.g., power consumption, could be added to the list. Finally, the circuit can be optimized based on the timing constraints corresponding to the pruned graph, as indicated at Block 218.

Figure 4:
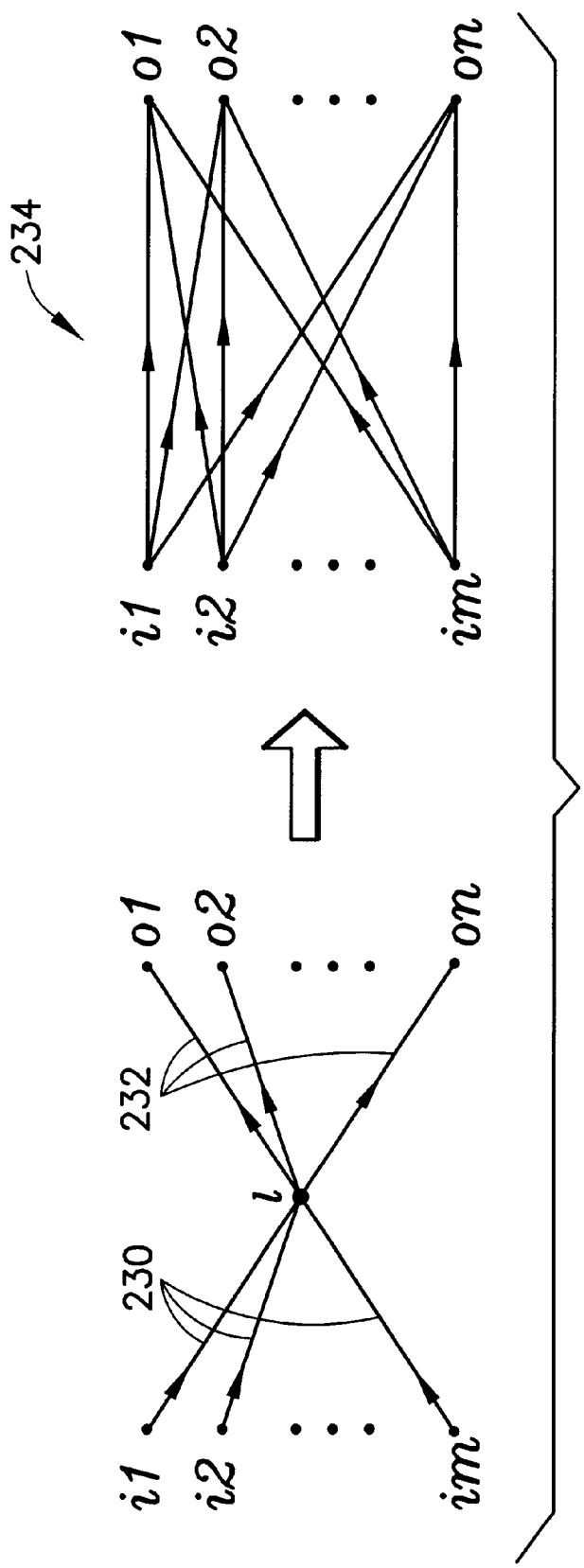
FIG. 4 depicts basic timing graph manipulation in accordance with the present invention.

Additional discussion will now be provided with respect to a method, according to the present invention, of pruning an initial timing graph for static optimization of a digital circuit. With reference to FIG. 4, a node 1 is shown which corresponds to an arrival time of a signal in the digital circuit. It is to be appreciated that each node in the circuit actually corresponds to both a rising and falling arrival time; for simplicity, a single node is typically shown on graphical representations. The timing graph can also include a plurality of directed edges 230, 232 which interconnect the nodes. The directed edges correspond to propagate segments in the digital circuit. A propagate segment in the graph corresponds to the delay in wires, transistors, inductors, capacitors and/or other circuit elements which a signal would undergo in propagating from one node of the graph to another. Those of the directed edges which are directed into a given node are referred to as fan-ins for that node and are themselves connected to associated fan-in nodes, while those of the edges directed out of the given node are referred to as fan-outs for that node and are connected to associated fan-out nodes. Still referring to FIG. 4, the directed edges which are fan-ins are designated as 230, while those which are fan-outs are designated as 232. The fan-in nodes are numbered $i_1, i_2, \ldots i_m$. The associated fan-out nodes for node 1 are $o_1, o_2, \ldots o_n$.

The concept of pruning a node, l, is illustrated in FIG. 4 by comparing the just-described structure on the left of the figure with that on the right of the figure. As shown therein, when a node l is pruned, it is removed from the initial timing graph to create a new timing graph wherein all of the fan-in nodes $i_1$ through $i_m$ are interconnected to all the fan-out nodes $o_l$ through $o_n$ through a plurality of new directed edges, designated generally as 234.

Referring back to FIG. 4, the timing constraints for the left-hand graph segment, prior to pruning, are as shown below:

$$AT_l \geq AT_{ij} + d_{ij,l} \forall j \in 1,2, \ldots, m \quad (1)$$

$$AT_{ok} \geq AT_l + d_{l,ok} \forall k \in 1,2, \ldots, n$$

Note that AT=arrival time, d=delay, subscript "l" refers to the indicated node, subscript "ij" refers to the jth fan-in node, subscript "ok" refers to the kth output node, and the subscripts of a given lower case d define the points between which the delay occurs. Note that the lower case d functions generally depend nonlinearly on transistor widths, fan-out capacitances and input slews. Pruning the node l from the timing graph shown in FIG. 4 corresponds to pruning the arrival time $AT_l$ from the above equations, to obtain:

$$AT_{ok} \geq AT_{ij} + d_{ij,l} + d_{l,ok} \forall j \in 1,2, \ldots, m, \forall k \in 1,2, \ldots, n \quad (2)$$

Referring back to FIG. 4 and the above discussion thereof, it can be seen that by choosing $$AT_l = \max(AT_{ij} + d_{ij,l}) \forall i \in 1,2, \ldots, m \quad (3)$$

the "pruned" set of constraints is equivalent to the original set of constraints.

Figure 5:
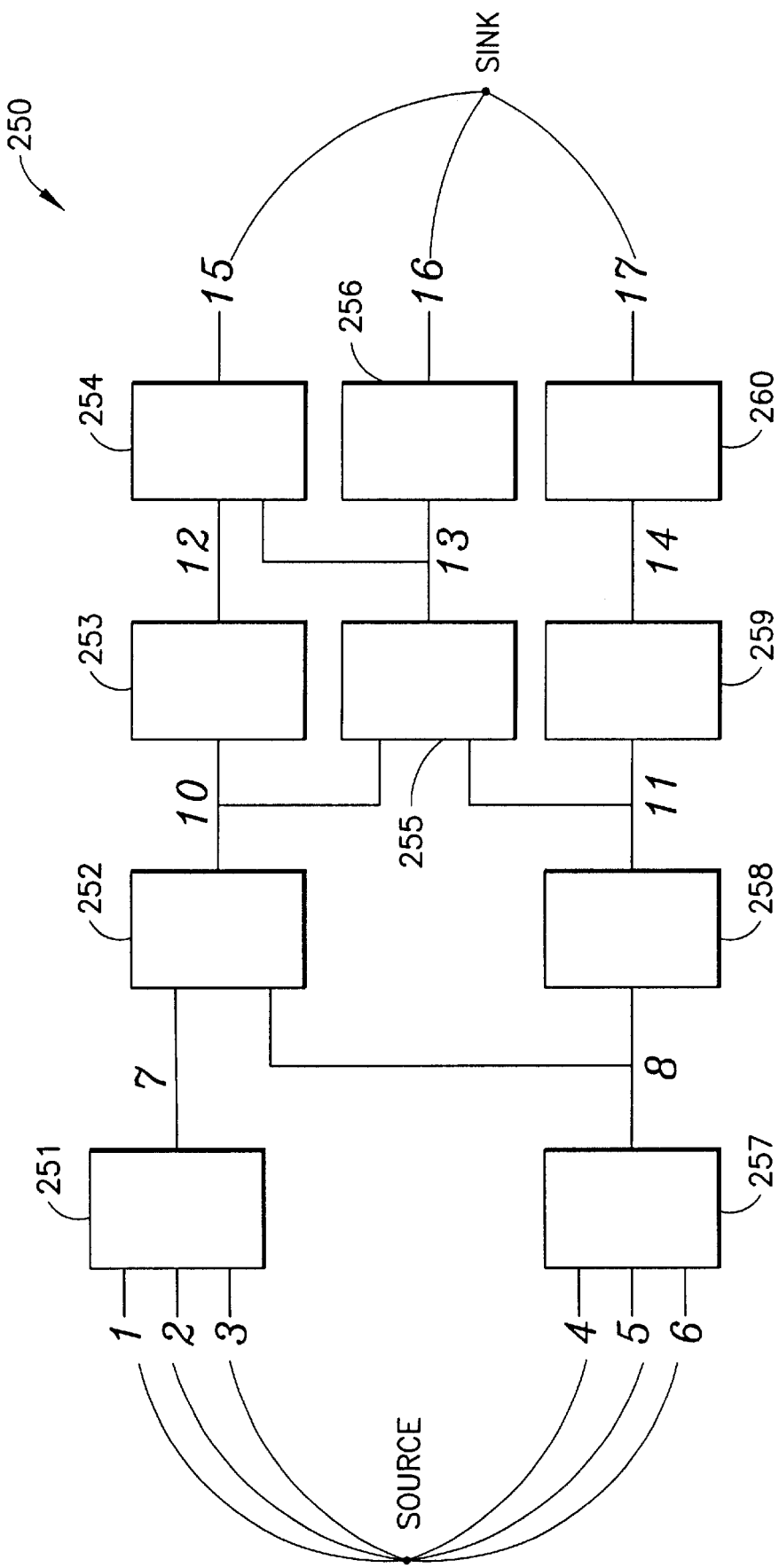
FIG. 5 depicts a sample circuit to be pruned according to the present invention.

One method of pruning, in accordance with the present invention, will now be illustrated, by way of example, with reference to FIGS. 5–13. With reference to FIG. 5, a circuit to be optimized, designated generally as 250, is depicted. The circuit has 16 arrival times numbered 1–8 and 10–17. Actually, each corresponds to both a rising and a falling arrival time, such that there are 32 arrival times. Source and sink arrival times are also shown, are labeled, and typically correspond to sequential timing points. The circuit in FIG. 5 also includes ten blocks, numbered 251–260, which correspond to circuit elements or collections of circuit elements having propagation delays.

Figure 6:
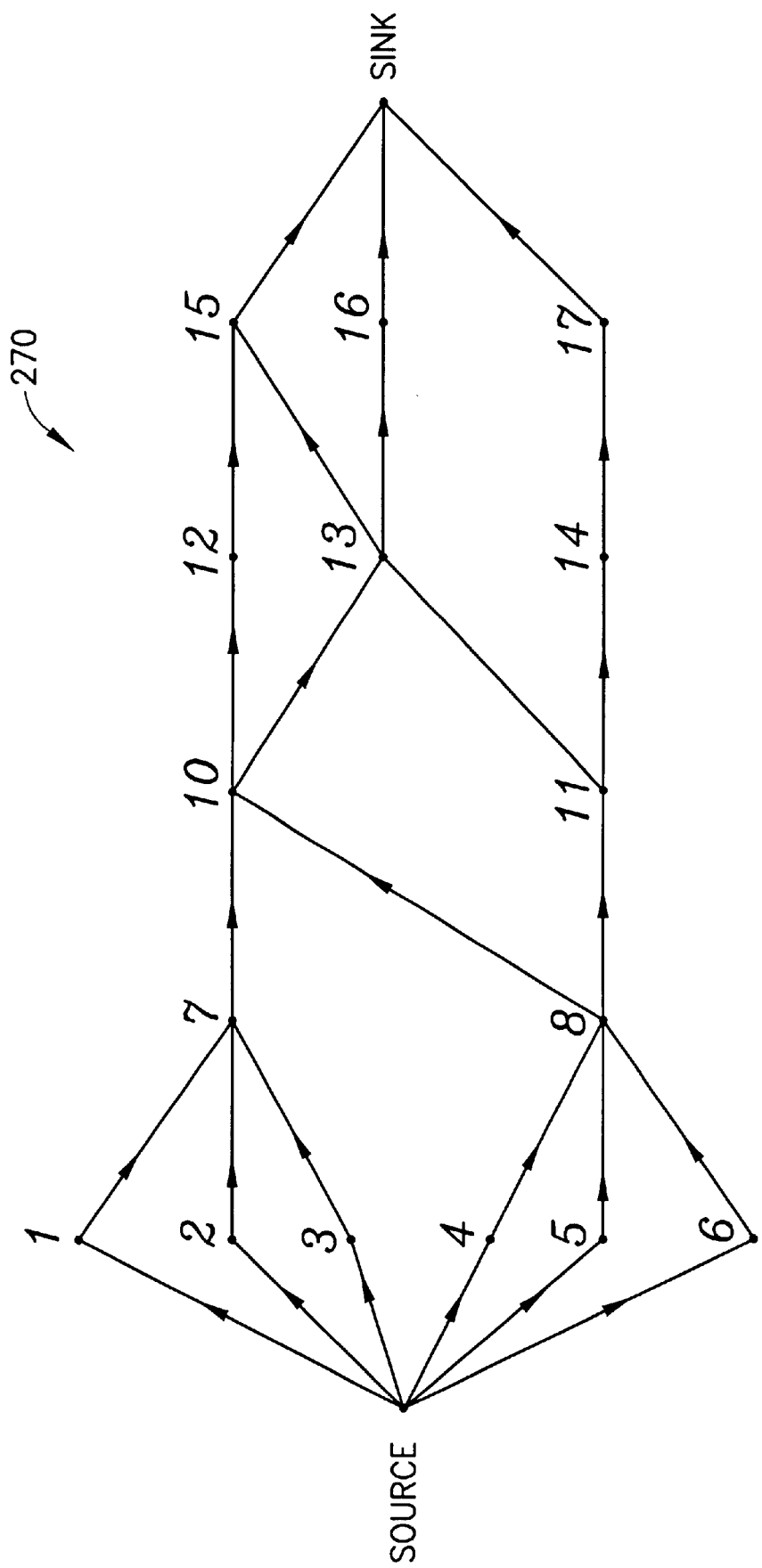
FIGS. 6 through 13 depict sequential steps in a sample pruning sequence, conducted in accordance with the present invention, on the sample circuit depicted in FIG. 5.

The circuit shown in FIG. 5 can be translated to the timing graph shown in FIG. 6. The timing graph has 16 nodes, numbered 1–8 and 10–17, which correspond to the 16 arrival times shown in FIG. 5. The timing graph itself is designated generally as 270, and is the initial timing graph for the example. Source and sink nodes are also depicted. The nodes are connected by a plurality of directed edges, that is, the line segments between the nodes (not separately labeled) which correspond to propagate segments in the digital circuit shown in FIG. 5. The propagate segments correspond to block delays through the circuit elements 251–260.

One step in the method of pruning according to the present invention includes examining a first group of the nodes to determine if every node in the first group of nodes is prunable. The first group of nodes includes at least a first one of the nodes in the initial timing graph 270, and can include more than one node if desired. The method will initially be illustrated with one-node groups for clarity. A given node is prunable if it can be removed from the timing graph as shown in FIG. 4. In general, this will be possible if the given node does not appear in a constraint which is not represented by the propagate segments. In such a case, the node can be classified as prunable. Accordingly, for each node, it is appropriate to determine whether it appears in a constraint which is not represented by the propagate segments. If it does appear in such a constraint, then it is classified as non-prunable. One example of a non-prunable node is a sequential timing point.

If every node of the first group is found to prunable, then the first group can be pruned by pruning every node in the first group, as described. Such pruning should only be carried out if it will be beneficial, as discussed below. The steps of examining the first group of nodes to determine if the group is prunable and then pruning the first group, if it is in fact prunable, and if the pruning would be beneficial, can then be repeated for a substantial number of additional groups of nodes. Each of the additional groups can include one or more nodes. The repetitive examination and pruning process results in the creation of a pruned timing graph which has enhanced qualities with respect to the initial timing graph 270 as shown in FIG. 6. The enhanced qualities include at least one of numerical qualities and compactness. Compactness refers to reduction in the problem size, as will be discussed more fully below. Enhanced numerical qualities include a reduction in redundancy and/or degeneracy, as also will be discussed below.

The timing constraints of the circuit shown in FIG. 5, and corresponding to the timing graph shown in FIG. 6, are set forth below, where minimization of the cycle time, z, of the circuit is the goal. RAT implies a "required arrival time" and AT implies an "arrival time". The subscripts refer to the given arrival times/nodes depicted in the figures. The $d_{ij}$ quantities refer to the propagation delays of blocks.

$$\begin{aligned}
\min \quad & z & (4) \\
s.t. \quad z &\geq RAT_{15} + d_{12,15} + AT_{12} \\
s.t. \quad z &\geq RAT_{15} + d_{13,15} + AT_{13} \\
s.t. \quad z &\geq RAT_{16} + d_{13,16} + AT_{13} \\
s.t. \quad z &\geq RAT_{17} + d_{14,17} + AT_{14} \\
s.t. \quad AT_{12} &\geq d_{10,12} + AT_{10} \\
s.t. \quad AT_{13} &\geq d_{10,13} + AT_{10} \\
s.t. \quad AT_{13} &\geq d_{11,13} + AT_{11} \\
s.t. \quad AT_{14} &\geq d_{11,14} + AT_{11} \\
s.t. \quad AT_{10} &\geq d_{7,10} + AT_{7} \\
s.t. \quad AT_{10} &\geq d_{8,10} + AT_{8}
\end{aligned}$$

Figure 7:
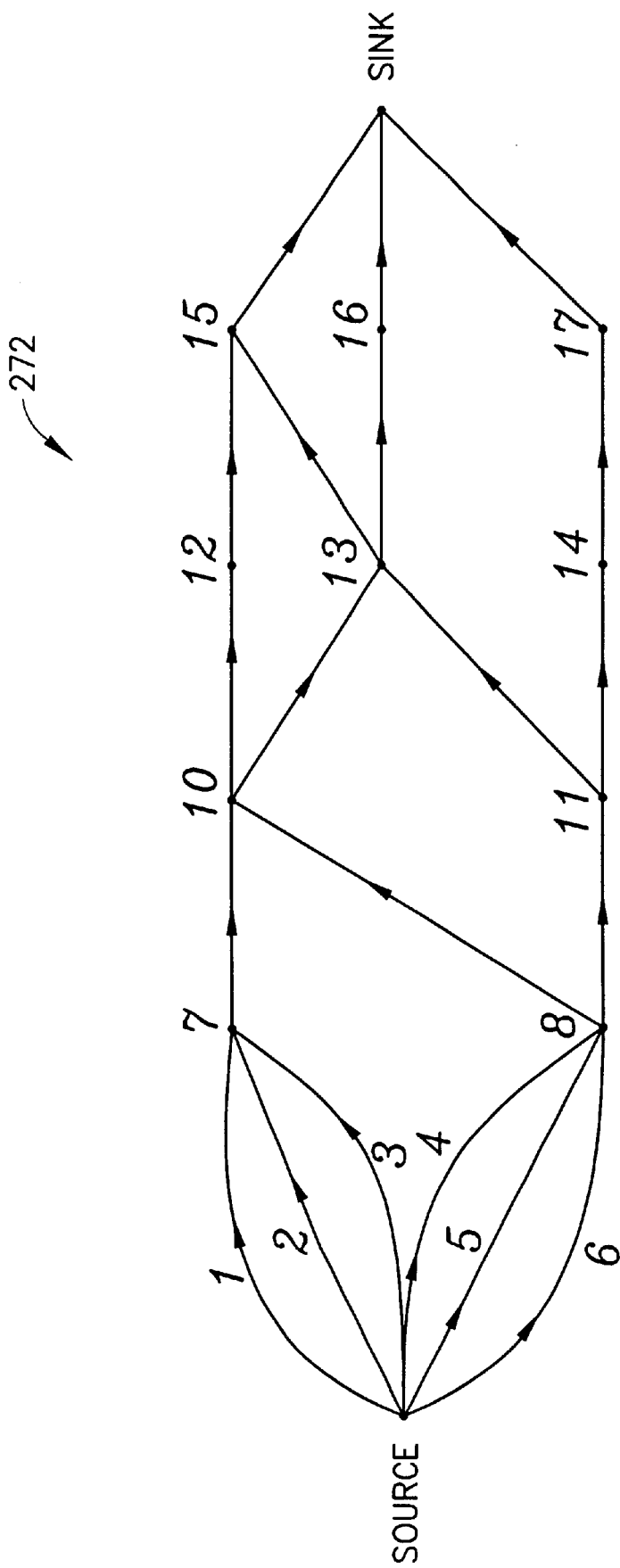

-continued s.t. $AT_{11} \geq d_{8,11} + AT_8$ s.t. $AT_7 \geq d_{1,7} + AT_1$ s.t. $AT_7 \geq d_{2,7} + AT_2$ s.t. $AT_7 \geq d_{3,7} + AT_3$ s.t. $AT_8 \geq d_{4,8} + AT_4$ s.t. $AT_8 \geq d_{5,8} + AT_5$ s.t. $AT_8 \geq d_{6,8} + AT_6$ An intermediate step in the pruning process is depicted in FIG. 7, which shows an intermediate result for a timing graph, designated generally as 272. Nodes 1–6 in FIG. 6 have been pruned. The new directed edges interconnecting the source node with nodes 7 and 8 are annotated with the pruned arrival times 1–6. This annotation will be employed later to generate the timing constraints. Note that each of the pruned nodes, in this illustrative case, has a single fan-in and a single fan-out.

Figure 8:
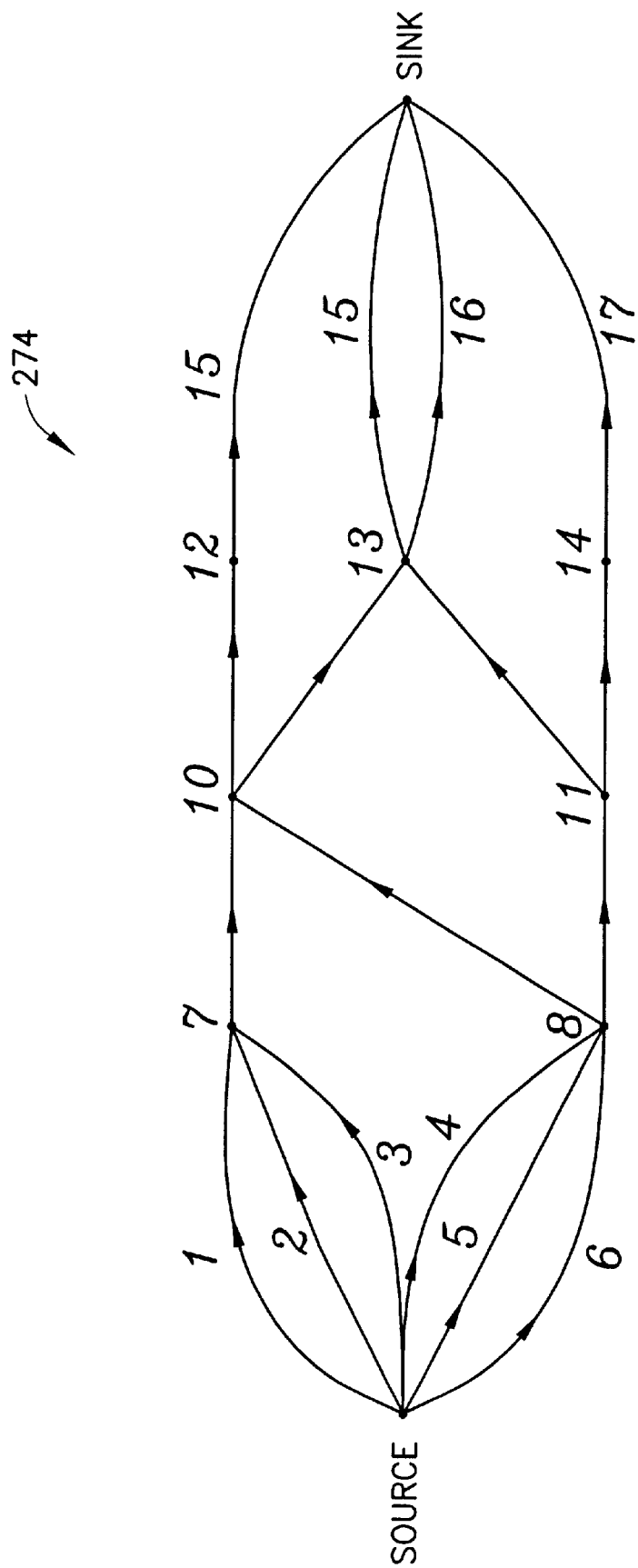

A later intermediate result is depicted as timing graph 274 in FIG. 8. Nodes 15, 16 and 17, each with a fan-out of one, were pruned from the timing graph 272 of FIG. 7 to obtain the timing graph 274 of FIG. 8. Again, the new directed edges are annotated to show the pruned arrival times.

Figure 9:
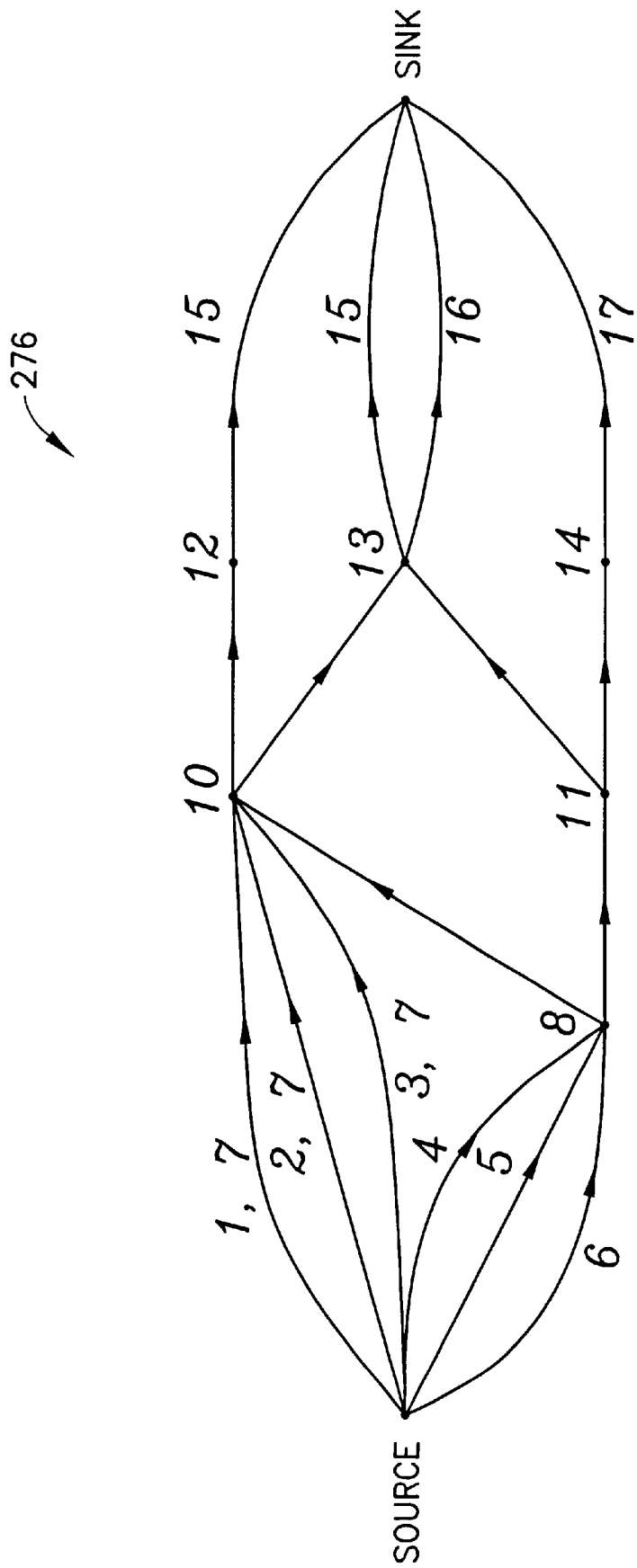
Figure 10:
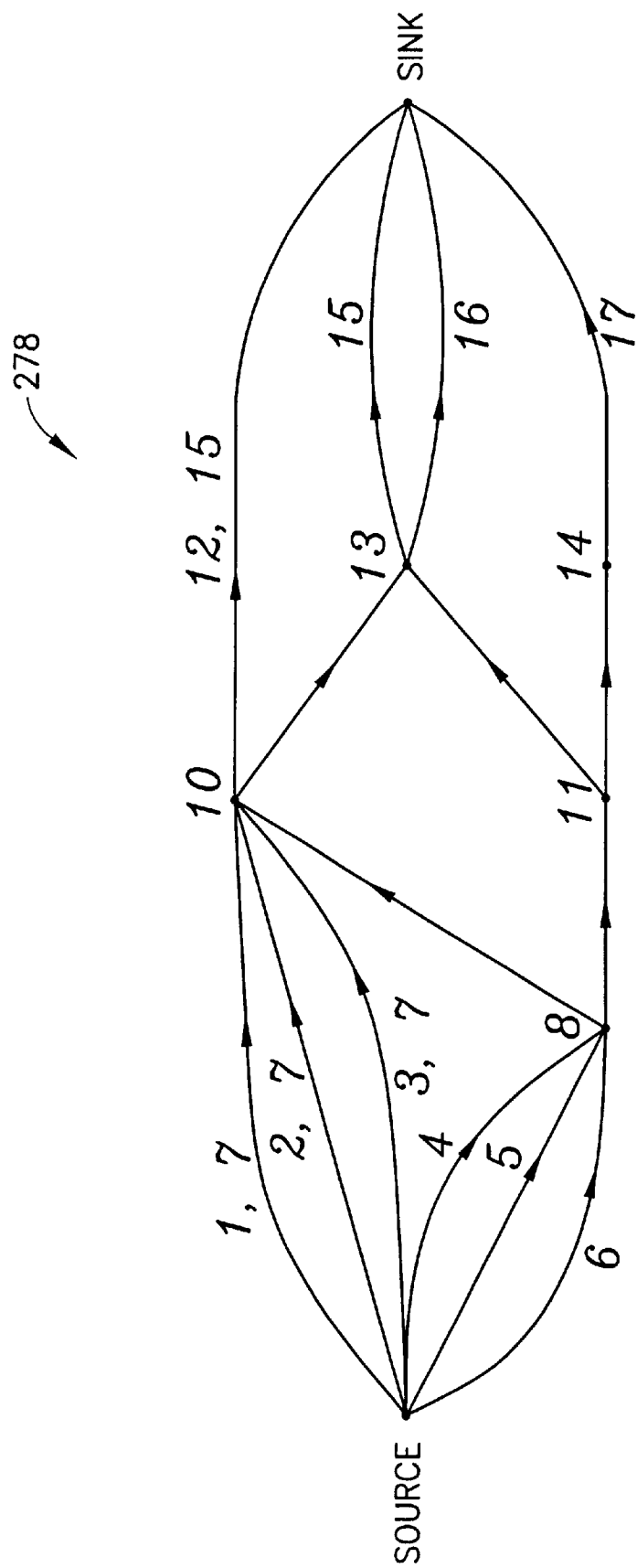
Figure 11:
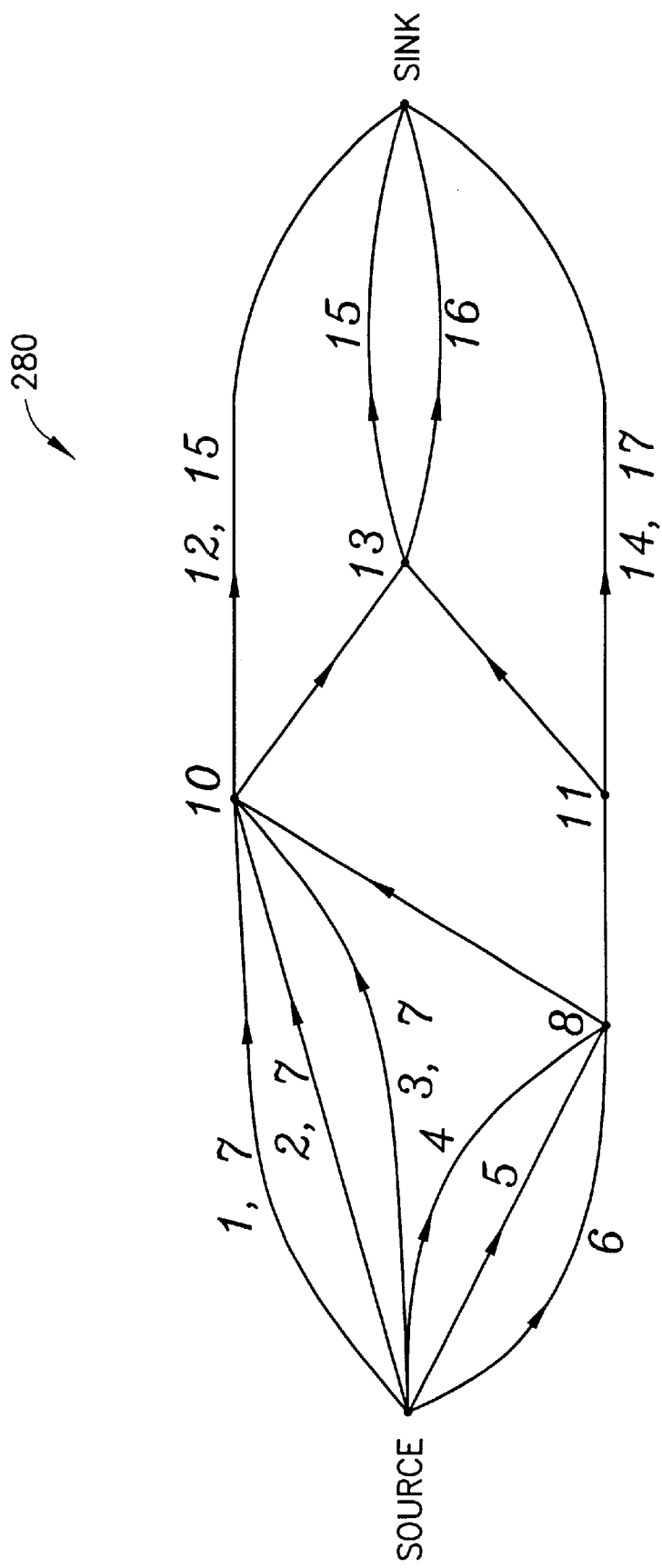
Figure 12:
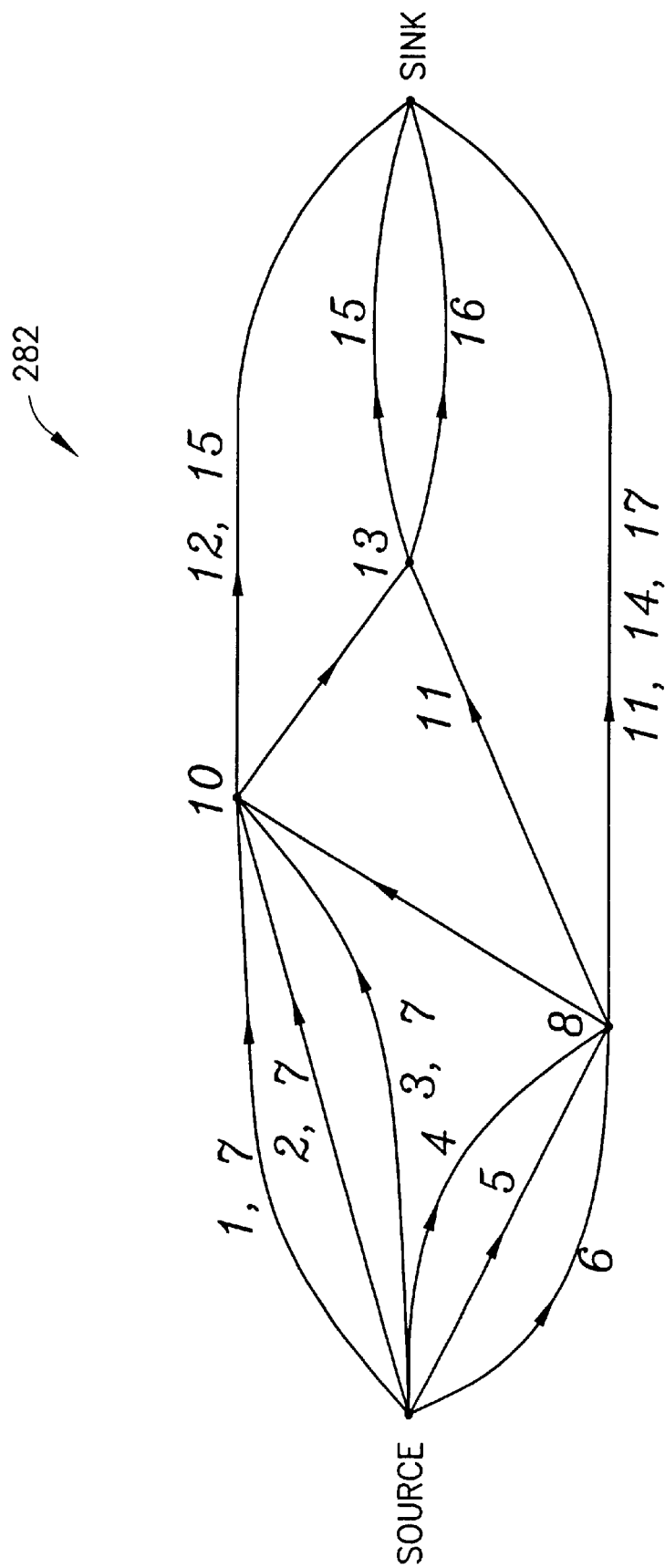
Figure 13:
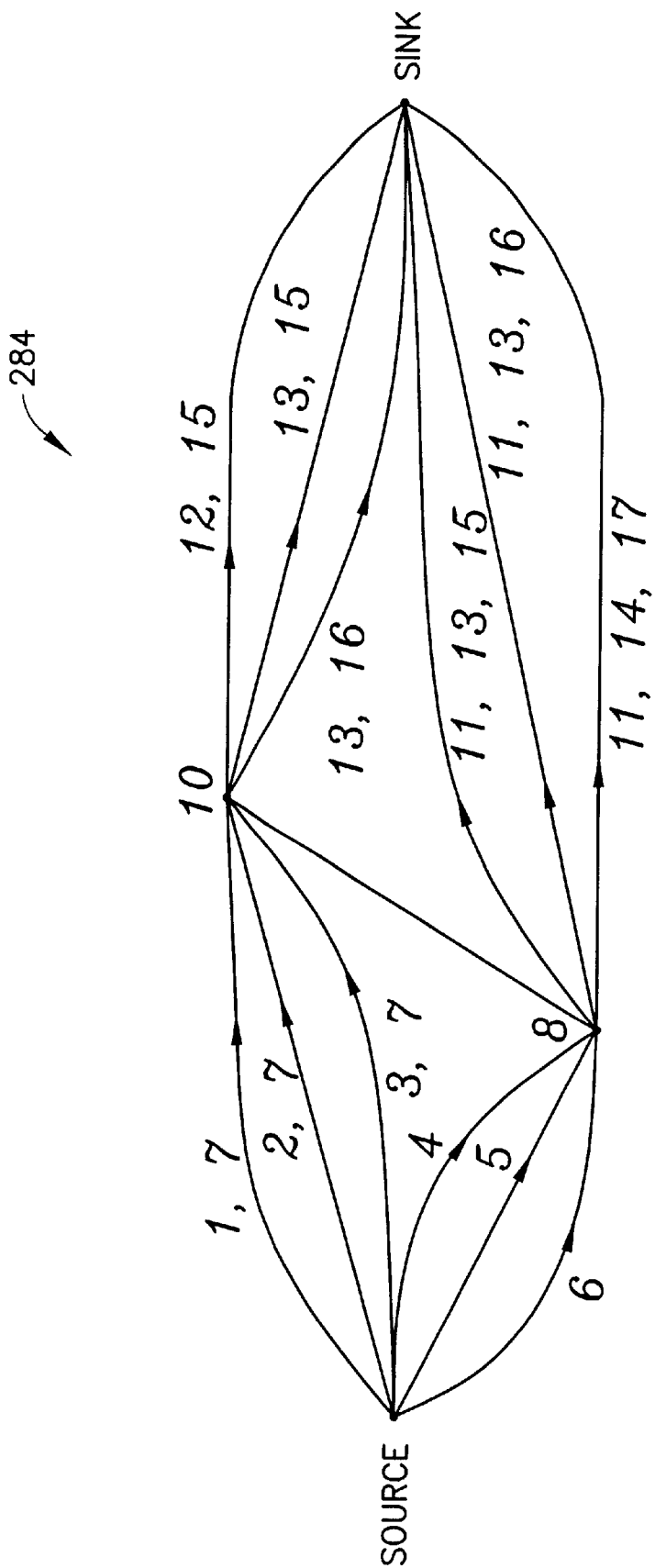

Node 7, having three fan-ins and one fan-out, is then pruned from graph 274 to obtain the graph 276 shown in FIG. 9. Note that now, three of the new directed edges contain annotations corresponding to two pruned nodes. Node 12, having a single fan-in and a single fan-out, is then pruned from the graph 276 of FIG. 9 to obtain the graph 278 of FIG. 10. Node 14, having a single fan-in and a single fan-out, is then pruned from the graph 278 of FIG. 10 to obtain the graph 280 of FIG. 1. Node 11, having a single fan-in and two fan-outs is then pruned from the graph 280 of FIG. 11 to obtain the graph 282 of FIG. 12. Finally, node 13, having two fan-ins and two fan-outs is pruned from the graph 282 in FIG. 12 to obtain the graph 284 in FIG. 13. The number of nodes in the graph has been reduced from sixteen to two, a factor of eight reduction, and the number of directed edges has been reduced from twenty-six to thirteen, a factor of two reduction. The timing constraints corresponding to the final pruned graph 284 are shown below.

min  $z$  (5)

s.t. $z \geq RAT_{15} + d_{12,15} + d_{10,12} + AT_{10}$ s.t. $z \geq RAT_{15} + d_{13,15} + d_{10,13} + AT_{10}$ s.t. $z \geq RAT_{16} + d_{13,16} + d_{10,13} + AT_{10}$ s.t. $z \geq RAT_{15} + d_{13,15} + d_{11,13} + d_{8,11} + AT_8$ s.t. $z \geq RAT_{16} + d_{13,16} + d_{11,13} + d_{8,11} + AT_8$ s.t. $z \geq RAT_{17} + d_{14,17} + d_{11,14} + d_{8,11} + AT_8$ s.t. $AT_{10} \geq d_{7,10} + d_{1,7} + AT_1$ s.t. $AT_{10} \geq d_{7,10} + d_{2,7} + AT_2$ s.t. $AT_{10} \geq d_{7,10} + d_{3,7} + AT_3$ s.t. $AT_{10} \geq d_{8,10} + AT_8$ s.t. $AT_8 \geq d_{4,8} + AT_4$ s.t. $AT_8 \geq d_{5,8} + AT_5$ -continued s.t. $AT_8 \geq d_{6,8} + AT_6$ The more compact formulation of the problem is easier and more efficient to solve. The pruning procedure takes relatively little computer time, while the savings in computer time during the optimization process is quite significant. With reference to FIG. 13 and the revised constraints set forth above, it will be appreciated that the method of pruning according to the present invention can also include the step of generating a plurality of constraints corresponding to the pruned timing graph, graph 284 in FIG. 13, for example, and that the plurality of constraints can be formulated for use in the static optimization of the digital circuit. While the derivation of constraints (5) was demonstrated by graph manipulation, it could, alternatively, be derived from (4) by algebraic manipulation.

As noted, the first group of nodes and the additional group of nodes can, if desired, each include only a single node. The pruning process can include removal of the given node, whether it be the first node or a subsequent node, and replacing it with new directed edges which connect each of the fan-in nodes for the pruned node to each of the fan-out nodes for the pruned node, as discussed above with reference to FIG. 4. Further, the repetition for additional groups of nodes can preferably be conducted for substantially all of the nodes in the graph, indeed, it would certainly be desirable to examine each and every node in the graph to see if it could be pruned. Of course, examining less than all groups of nodes, although believed to be less desirable, is still within the scope of the present invention.

As noted, one step in the method of the present invention includes a determination of whether pruning of a given node, or group of nodes, would be beneficial. The benefits of pruning can be determined, for example, on the basis of at least one of the following criteria: reduced size, reduced redundancy, and reduced degeneracy. The benefits are typically determined by comparison to a prior result. The first time a pruning decision is made, the comparison can be made between the initial timing graph and the timing graph which would result based on the proposed pruning. Once pruning has been conducted, a comparison of size, redundancy and/or degeneracy can be made between the most previous intermediate result and the timing graph which would result from the proposed pruning. The most previous intermediate result refers to the timing graph as modified by previous beneficial pruning steps. Accordingly, a recursive approach can be adopted.

As noted, reduced size is one criteria which can help determine whether pruning would be beneficial. The reduction in size can be determined by comparing the number of nodes and the number of directed edges before pruning with the number of nodes and the number of directed edges after pruning. The nodes and edges before pruning can be summed, as can the number of nodes and edges after pruning, and the sums can be compared. A post-pruning sum which is less than the pre-pruning sum indicates a favorable reduction in size. The sums can be weighted or unweighted. Mathematically, the problem size can be designated as X and calculated as shown below:

$$W_1 \times (\text{number of nodes}) + W_2 \times (\text{number of edges}) = X \quad (6)$$

The first weight $W_1$ multiplies the number of nodes and the second weight $W_2$ multiplies the number of edges. At present, it is believed that good results can be obtained with $W_1 = W_2 = 1$. However, unequal weighting, that is, $W_1$ not equal to $W_2$ might be desirable in some cases, for example, if a given optimizer had more benefit with fewer nodes than edges, $W_1$ could be made greater than $W_2$. The converse would also be true.

If we define m as the number of fan-in nodes for a given one of the nodes and it as the number fan-out nodes for the given one of the nodes, pruning on the basis of reduced size can be implemented by pruning when the inequality 2 $mn \leq 2(m+n)+2$ is satisfied. The foregoing inequality assumes that $W_1=W_2=1$.

Table 1 below shows the gain, that is, the reduction in problem size from pruning operations for a given node with m fan-ins and n fan-outs.

TABLE 1

| | m | | | |
|---|---|---|---|---|
| n | 1 | 2 | 3 | 4 |
| 1 | 4 | 4 | 4 | 4 |
| 2 | 4 | 2 | 0 | -2 |
| 3 | 4 | 0 | -4 | -8 |
| 4 | 4 | -2 | -8 | -14 |

As shown in TABLE 1, for some values of m and n, a gain of 4 can be obtained, and pruning is clearly advantageous. In some cases, only a gain of 2 is obtained, and in some cases there is a gain of zero. Yet further, in some cases the "gain" is negative, which means that the size of the problem actually increases.

A preferred form of pruning will now be described. In this case, a gain from pruning is defined at least as a reduction in the problem size X. The repetition of the examining and pruning steps, described above, is initially performed only when the gain is at least equal to a first test value, for example, a value of 4. Then, additional method steps are added including the definition of a second test value which is less than the first test value, for example, a value of 2. The examining, pruning and repetition steps are then again repeated after the first pass-through with the first test value, with the repetition being conducted for the second test value, wherever the gain is at least equal to the second test value. In this way, substantially all the available gains which are at least equal to the first test value, that is, in this example, 4, can be obtained before attempting to obtain gains which are least equal to the second test value, for example, in this case, 2. By not pruning gains of 2 on the first pass-through, we avoid eliminating potential (gains of 4; gains of the lower value are only taken after substantially all available gains of the higher value are obtained.

It will be appreciated that where gains of other than 4 or 2 are possible (e.g., unequal weighting factors), additional repetitions could be conducted; indeed, if there were some reason to conduct pruning when negative gains were anticipated, additional repetitions could also be performed. However, it is believed most preferable that pruning be performed first for a gain of 4, then for a gain of 2, and finally for a gain of zero. Accordingly, the method can include the additional steps of defining a third test value which is equal to zero, and which is accordingly less than the first and second test values, and then again repeating the steps of examining, pruning, and repetition for additional groups, after they have been previously repeated for the first and second test values. Such repetition is conducted whenever the gain is at least equal to zero. The purpose of pruning for a gain of zero is to obtain a potential reduction in at least one of redundancy and degeneracy. It has been found that by pruning with a gain of zero, at least one of redundancy and degeneracy is, on average, reduced with a substantial degree of probability. Again, it is to be emphasized that any desired number of pruning steps can be conducted for a corresponding number of test values, preferably beginning at a test value for the highest anticipated gain and moving successively lower to a final test value, preferably stopping at a test value corresponding to a gain of zero. It is desirable that substantially all nodes be examined at each successive test value.

This can be further explained as follows. Pruning of any given node, or its corresponding arrival time, does not necessarily result in a reduction in redundancy and/or degeneracy, with a gain of zero. However, a number of experiments indicate that significant improvement in redundancy and degeneracy can occur when a number of nodes, or arrival times, are pruned with a gain of zero. The improvements to be expected will depend on the complexity of the circuit. With regard to the substantial degree of probability, it is to be appreciated that any degree of probable reduction in redundancy or degeneracy is desirable. For example, in four of twenty-one sample circuits studied, a ten percent or higher reduction in the number of degenerate constraints was obtained.

As noted, one step of the method can include generating a plurality of constraints corresponding to the pruned timing graph. Such generation can include generating timing constraints associated with the new directed edges from the pruning step, and the generated timing constraints can include a summation of corresponding block delays, such that the corresponding block delays are effectively replaced by path delays associated with the new directed edges. The foregoing will be best understood with a reference back to FIGS. 5–13 and the discussion thereof.

In the modified problem formulation after pruning, slews can be handled in one of two ways. In the first method, all slew variables can be retained, and each block can be timed individually. In the second method, summations of block delays can be interpreted as path delays, and each path can be timed individually. In the latter case, slew variables at intermediate points of the path need not be explicit variables of the optimization. Rather, they are implicitly propagated by the path timing procedure. Depending on the method chosen, the gain table can be modified. The first method of handling slews is used in the preferred embodiment.

As noted above, examination and pruning can be conducted for individual nodes, or for groups of nodes. Examination and pruning for individual nodes can be equivalently referred to as examination and pruning of groups of nodes which each contain only one node. However, there can be one or more multi-node groups, whether it be the first group of nodes or any one of the additional groups of nodes. A multi-node group must include at least two nodes. All groups could be the same size, or groups of varying sizes could be mixed, including groups of only a single node.

Figure 14:
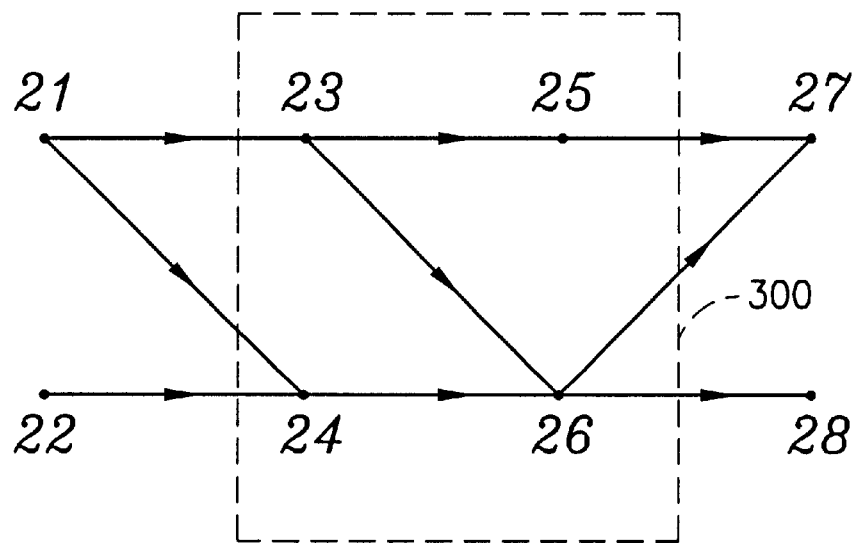
FIG. 14 depicts pruning of a circuit, in accordance with the present invention, wherein groups of more than one node are pruned at a time.
Figure 15:
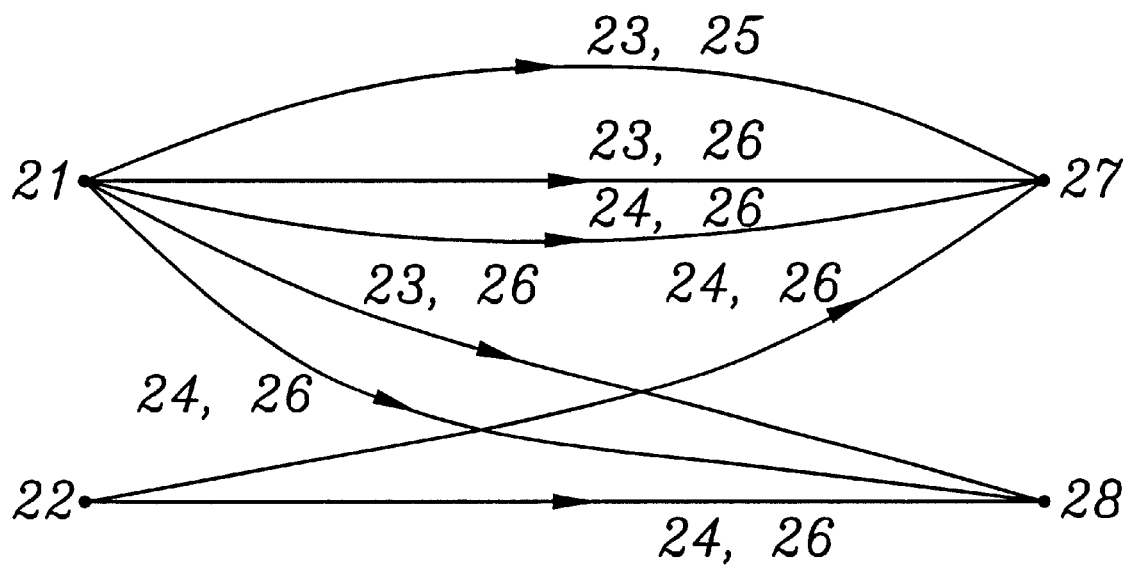
FIG. 15 depicts a reworked timing graph resulting from the pruning of the circuit depicted in FIG. 14.

Attention should now be given to FIGS. 14 and 15 for illustration of an example of pruning a multi-node group, in accordance with the present invention. With reference to FIG. 14, a timing graph includes nodes numbered 21–28. Four of the nodes, numbered 23–26, form a multi-node group designated 300. The group 300 can be examined to determine if every node therein is prunable. One way in which this can be done is to determine whether each node in the group 300 appears in a constraint not represented by the propagate segments. As discussed above, one example of this type of node would be a sequential timing point. Any given one of the nodes is prunable if it does not appear in a constraint not represented by the propagate segments, and conversely, can be classified as non-prunable if it does in fact appear in such a constraint. The group 300 will be classified as prunable if every node therein is indeed prunable. The pruning can comprise identification of fan-in nodes for a given group, here, nodes 21 and 22, followed by identification of fan-out nodes for the group, here, nodes 27 and 28. It is to be understood that the graph of FIG. 14 could be a portion of an initial timing graph, or of an intermediate result as discussed above. A next step in the method can include identification of all paths through a most previous timing graph, as shown in FIG. 14, from each of the fan-in nodes 21,22 to each of the fan-out nodes for the given group, here, 27 and 28. The pruned nodes, here nodes 23–26, can then be removed. The original edges in the original (or intermediate) timing graph can then be replaced with one new edge for each path identified in the step of identifying all the paths.

With continued reference to FIG. 14, and referring now also to FIG. 15, node 21 is connected to nodes 27 and 28 by paths corresponding to all the possible paths in the structure shown in FIG. 14. For example, node 21 is connected to node 27 via a direct path through 23 and 25, an alternative path through 23 and 26, and another alternative path through 24 and 26. Similar connections are made between the other nodes. Appropriate constraints can be formulated for the new edges. These are indicated by the notations such as 23, 26 shown in FIG. 15. They refer to the delays between nodes 21 and 28 via that path in the original graph shown in FIG. 14. Again, in this method, repetition for a substantial number of additional groups can preferably comprise repetition for substantially all of the additional groups. While gains could be made from pruning even one group, or only a few groups, it is believed advantageous that substantially all, or indeed all available groups be pruned.

The set of constraints (7) below correspond to the "before pruning" condition in FIG. 14.

$$\min \quad z \quad (7)$$
$$s.t. \quad z \geq RAT_{27} + d_{25,27} + AT_{25}$$
$$s.t. \quad z \geq RAT_{27} + d_{26,27} + AT_{26}$$
$$s.t. \quad z \geq RAT_{28} + d_{26,28} + AT_{26}$$
$$s.t. \quad AT_{25} \geq d_{23,25} + AT_{23}$$
$$s.t. \quad AT_{26} \geq d_{23,26} + AT_{23}$$
$$s.t. \quad AT_{26} \geq d_{24,26} + AT_{24}$$
$$s.t. \quad AT_{23} \geq d_{21,23} + AT_{21}$$
$$s.t. \quad AT_{24} \geq d_{21,24} + AT_{21}$$
$$s.t. \quad AT_{24} \geq d_{22,24} + AT_{22}$$

The set of constraints (8) below correspond to the pruned condition in FIG. 15.

$$\min \quad z \quad (8)$$
$$s.t. \quad z \geq RAT_{27} + d_{25,27} + d_{23,25} + d_{21,23} + AT_{21}$$
$$s.t. \quad z \geq RAT_{27} + d_{26,27} + d_{23,26} + d_{21,23} + AT_{21}$$
$$s.t. \quad z \geq RAT_{27} + d_{26,27} + d_{24,26} + d_{21,24} + AT_{21}$$
$$s.t. \quad z \geq RAT_{27} + d_{26,27} + d_{24,26} + d_{22,24} + AT_{22}$$
$$s.t. \quad z \geq RAT_{28} + d_{26,28} + d_{23,26} + d_{21,23} + AT_{21}$$
$$s.t. \quad z \geq RAT_{28} + d_{26,28} + d_{24,26} + d_{21,24} + AT_{21}$$
$$s.t. \quad z \geq RAT_{28} + d_{26,28} + d_{24,26} + d_{22,24} + AT_{22}$$

It is to be understood that the present invention is applicable to, and that the claims herein are intended to cover, both late mode, early mode, and simultaneous late and early mode optimization. For simplicity, the examples given herein are shown for late mode.

The foregoing, discussion has considered circuit optimization problems represented in timing graph form. However, it is possible to apply the pruning of the present invention to circuit optimization problems which are not explicitly represented in timing graph form. In this case, arrival times in the optimization problem, as opposed to nodes in the graph, are pruned. Furthermore, constraints can be algebraically manipulated as will be described in greater detail.

Figure 3:
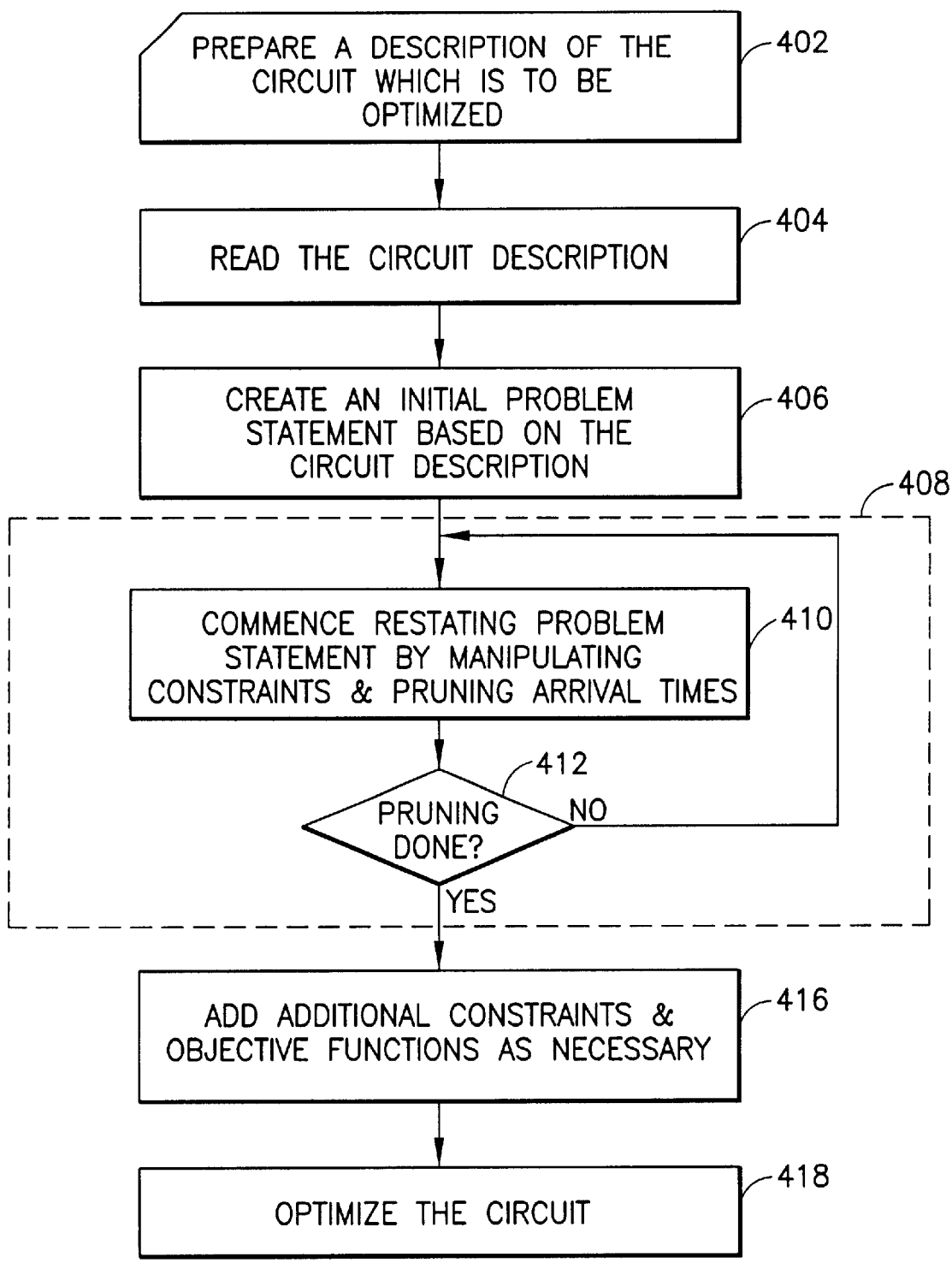
FIG. 3 is a flow chart similar to FIG. 2, but wherein a timing graph representation is not employed.

With reference to FIG. 3, an alternative method for static optimization of a digital circuit, and a method of restating an initial statement of a circuit optimization problem for static optimization of a digital circuit, will be described. The problem statement has a plurality of arrival times of signals in the digital circuit, which correspond to the nodes of the above-discussed timing graphs, and the problem also has a plurality of constraints. Again, it is to be emphasized that this method can be conducted without the use of timing graphs. Referring to FIG. 3, in block 402, a "netlist" or other description of the circuit which is to be optimized can be prepared, as discussed above with reference to FIG. 2. The description can then be read, at block 404. From the circuit description which has been read, an initial problem statement can be created based on the circuit description, as at block 406. The problem can then be restated, as per block 40S, according to the present invention, to place it in a better form for solution. Restatement of the problem can be commenced by manipulating constraints and pruning arrival times, rather than nodes, as shown at block 410. A decision can then be made whether the pruning is complete, at block 412. If incomplete, restatement of the problem can continue; if complete, any additional constraints and objective functions can be added, as necessary, at block 416, and the circuit can then be optimized at block 418. Note that, in this method, the timing constraints corresponding to the restated problem statement are inherently developed during the problem restatement and need not be separately listed.

The problem restatement according to this embodiment of the invention can proceed as follows. All those of the constraints in which at least a first group of the arrival times occur can be examined to determine if the constraints in which the first group of arrival times occur can be algebraically eliminated or pruned. This step is analogous to the step of examining a group of nodes to see if they are prunable, as in the method discussed above. One manner to perform the examination is to determine whether any single arrival time in the group of arrival times appears nonlinearly in any constraint. The single arrival time under examination can be classified as prunable if it does not appear nonlinearly in any constraint, and can be classified as non-prunable if it does appear nonlinearly in any constraint.

In addition to the examining step, the method can also include the step of manipulating the constraints in which the first group of arrival times occur if these constraints are in fact determined to be constraints which can be manipulated, so as to prune the first group of arrival times. The manipulation, that is, the pruning of the arrival time or arrival times, is typically only performed if the manipulation would be beneficial. The examination and manipulation steps can be repeated for a substantial number of additional arrival time groups so as to create a pruned restatement of the optimization problem which has enhanced qualities with respect to the initial statement of the optimization problem. These enhanced qualities can include at least one of numerical qualities and compactness, as discussed above.

Just as in the timing graph methods, in the non-timing graph method, individual arrival times or groups of more than one arrival time can be examined, and pruned, if desirable. Thus, in one embodiment, both the first group of arrival times and the additional groups of arrival times may each include only a single arrival time. The manipulating step can include replacing the constraints in which the first group of arrival times occur with a second, equivalent set of constraints, derived by taking linear combinations of the original constraints, and wherein pruned arrival times have been eliminated. This manipulation has been illustrated above with respect to relationships (1), (2) and (3). The repetition for a substantial number of additional arrival time groups is preferably conducted for substantially all of the additional arrival time groups. While pruning of any small number of arrival times is beneficial, it is believed that pruning all prunable arrival times, so long as the pruning is beneficial, is desirable.

In determining whether manipulation would be beneficial, at least one of the following criteria can be used: reduced size, reduced redundancy, and reduced degeneracy. As in the first method, the comparison can be on the basis of a previous problem statement without manipulation. This previous statement can be the initial problem statement, for the first comparison, and can be an intermediate result after initial manipulations have been performed. Where reduced size is used as the sole criteria, or as one of the criteria, to determine if manipulation is beneficial, the size can be determined by a comparison of the number of arrival times and the number of constraints before manipulation with the number of arrival times and the number of constraints after manipulation. The number of arrival times and constraints before manipulation can be summed, and then can be compared to the sum of the number of arrival times and the number of constraints after manipulation. As in the first method, the sum can be weighted or unweighted. The following equation, which is analogous to equation (5) for the first method, can be used to determine the problem size.

$$W_1 \times (\text{number of arrival times}) + W_2 \times (\text{number of constraints}) = X \quad (9)$$

X is the problem size, while $W_1$ and $W_2$ are the weights, respectively, for the number of arrival times and the number of constraints. If the weight factors are taken as equal, and if we define m as the number of fan-in arrival times for a given one of the arrival times and n as the number of fan-out arrival times for a given one of the arrival times, the inequality $2 \text{ mn} \leq 2(m+n)+2$ can again be used to determine whether manipulation is desirable.

Just as for the first method, which used timing graphs, a multi-step pruning process can be employed. The repetition of the examining and manipulating steps can initially be performed only when gain is at least equal to a first test value. The (gain is defined as the reduction in X. A subsequent repetition of the steps can then be performed when the gain is at least equal to a second test value, less than the first test value. Again, this provides the advantage of not missing any high gains by taking lower gains on the first pass; and again, repetition for a gain of zero can also be performed to reduce redundancy and degeneracy, on average, with a substantial degree of probability, as discussed above.

Just as for the first method, using the timing graph representation of the problem, it is possible to examine pruning of groups of arrival times having more than one arrival time therein. Thus, the first group of arrival times, or at least one of the additional arrival time groups, can have at least two arrival times. In this case, each arrival time in a given group can be examined to determine whether it appears nonlinearly in any constraint. If it does not appear nonlinearly, it can be classified as prunable, while if it does appear nonlinearly, it can be classified as non-prunable. A given group can be classified as prunable if every arrival time therein is prunable. The manipulation step can include replacing the constraints in which the first group of arrival times occur with a second, equivalent set of constraints wherein the pruned arrival times have been eliminated. Finally, the repetition for a substantial number of additional arrival time groups comprises repeating for substantially all of the additional arrival time groups. Note that groups can be of different sizes, with some having only a single arrival time and some having multiple arrival times, or with all groups having multiple arrival times, or any combination thereof. Reference should be had to the sets of constraints (7) and (8) above. The set (8) can be obtained directly from set (7), without use of a timing graph, using the method just described.

It should again be noted that the algebraic method of the present invention (i.e., where timing graphs are not used), and the claims directed thereto, include late mode, early mode, and simultaneous late and early mode optimization.

The present invention also includes a digital circuit optimized by any of the methods set forth herein. Further, the present invention includes a program storage device, readable by machine, and tangibly embodying a program of instructions executable by the machine to perform method steps corresponding to any of the methods set forth herein. These methods include the method of pruning the initial timing graph, the method of restating an initial statement of a circuit optimization problem, and the corresponding methods for static optimization of digital circuits using each of the aforementioned methods.

EXAMPLES

A method in accordance with the present invention was used to prune, and reformulate, fifteen typical circuit optimization problems. As shown in TABLE 2 below, not counting the first problem, due to reasons of fairness, there was an average factor of 18.3 reduction in the number of arrival time variables, an average 32.7% reduction in the total number of variables, an average 42.9% reduction in the number of timing constraints, and an average 21.8% reduction in the number of total constraints. The first problem was thought to be relatively small, so that it might give somewhat optimistic results, and thus was not counted.

TABLE 2

| Problem Number | # gates | # AT vars. w/o pruning | # AT vars. w/ pruning | # AT vars. reduction | # total vars. w/o pruning | # total vars. w/ pruning | # total vars. reduction | # timing constraints w/o pruning | # timing constraints w/ pruning | # timing constraints reduction | # total constraints w/o pruning | # total constraints w/ pruning | # total constraints reduction |
|---|---|---|---|---|---|---|---|---|---|---|---|---|---|
| 1 | 3 | 9 | 1 | 9× | 23 | 15 | 34.8% | 8 | 8 | 75% | 15 | 9 | 40% |
| 2 | 7 | 25 | 1 | 25× | 63 | 39 | 38.1% | 32 | 22 | 31.3% | 61 | 51 | 16.4% |
| 3 | 9 | 25 | 5 | 5× | 67 | 47 | 29.9% | 40 | 28 | 30.0% | 75 | 63 | 16.0% |
| 4 | 10 | 33 | 5 | 6.6× | 85 | 57 | 32.9% | 40 | 26 | 35.0% | 75 | 61 | 18.7% |
| 5 | 14 | 35 | 3 | 11.7× | 97 | 65 | 33.0% | 50 | 24 | 52.0% | 97 | 71 | 26.8% |
| 6 | 22 | 61 | 1 | 61× | 165 | 105 | 36.4% | 74 | 32 | 56.8% | 147 | 105 | 28.6% |
| 7 | 41 | 101 | 5 | 20.2× | 283 | 187 | 33.9% | 178 | 104 | 41.6% | 342 | 268 | 21.6% |
| 8 | 175 | 363 | 21 | 17.3× | 1,075 | 733 | 31.8% | 1,010 | 690 | 31.7% | 1,893 | 1,573 | 16.9% |
| 9 | 180 | 417 | 13 | 32.1× | 1,193 | 789 | 33.9% | 618 | 280 | 54.7% | 1,203 | 865 | 28.1% |
| 10 | 299 | 671 | 23 | 29.2× | 1,939 | 1,291 | 33.4% | 968 | 440 | 54.5% | 1,929 | 1,401 | 27.4% |
| 11 | 408 | 945 | 85 | 11.1× | 2,705 | 1,845 | 31.8% | 1,682 | 1,072 | 36.3% | 3,237 | 2,627 | 18.8% |
| 12 | 481 | 1,083 | 107 | 10.1× | 3,127 | 2,151 | 31.2% | 1,630 | 838 | 48.6% | 3,213 | 2,421 | 24.6% |
| 13 | 628 | 1,457 | 125 | 11.7× | 4,169 | 2,837 | 32.0% | 2,776 | 1,724 | 37.9% | 6,859 | 5,807 | 15.3% |
| 14 | 665 | 1,413 | 177 | 8.0× | 4,155 | 2,919 | 29.7% | 2,244 | 1,206 | 46.3% | 4,425 | 3,387 | 23.5% |
| 15 | 667 | 1,417 | 183 | 7.7× | 4,167 | 2,933 | 29.6% | 2,280 | 1,274 | 44.1% | 4,497 | 3,491 | 22.4% |
| Avg. not counting Prob. #1 | | | | 18.3× | | | 32.7% | | | 42.9% | | | 21.8% |

With reference to Table 3, it will be seen that in most cases degeneracy was reduced by pruning according to the present invention. In a few cases degeneracy increased with pruning.

TABLE 3

| Problem Number | # degen. AT vars. w/o pruning | # degen. AT vars. w/ pruning | # degen. timing const. w/o pruning | # degen. timing const. w/ pruning | # degen. vars. w/o pruning | # degen. vars. w/ pruning | # degen. const w/o pruning | # degen. const w/ pruning |
|---|---|---|---|---|---|---|---|---|
| 1 | 0 | 0 | 0 | 0 | 0 | 0 | 0 | 0 |
| 2 | 0 | 0 | 0 | 0 | 0 | 0 | 0 | 0 |
| 3 | 0 | 0 | 0 | 0 | 0 | 0 | 0 | 0 |
| 4 | 0 | 0 | 0 | 0 | 0 | 0 | 0 | 0 |
| 5 | 0 | 0 | 2 | 0 | 0 | 0 | 2 | 0 |
| 6 | 0 | 0 | 0 | 0 | 0 | 0 | 1 | 1 |
| 7 | 0 | 1 | 9 | 0 | 2 | 3 | 11 | 2 |
| 8 | 2 | 1 | 46 | 1 | 2 | 1 | 59 | 20 |
| 9 | 0 | 0 | 8 | 0 | 0 | 0 | 17 | 5 |
| 10 | 0 | 0 | 18 | 0 | 0 | 0 | 34 | 9 |
| 11 | 0 | 0 | 70 | 2 | 0 | 0 | 89 | 2 |
| 12 | 0 | 0 | 26 | 0 | 0 | 0 | 42 | 7 |
| 13 | 0 | 0 | 53 | 8 | 24 | 13 | 103 | 36 |
| 14 | 0 | 0 | 3 | 2 | 0 | 0 | 5 | 10 |
| 15 | 0 | 0 | 6 | 2 | 0 | 0 | 6 | 11 |

However, on the balance, pruning appears to offer substantial potential for the reduction of degeneracy.

While there have been described what are presently believed to be the preferred embodiments of the invention, those skilled in the art will realize that various changes and modifications may be made to the invention without departing from the spirit of the invention, and it is intended to claim all such changes and modifications as fall within the scope of the invention.

What is claimed is:

1. A method of pruning an initial timing graph for static optimization of a digital circuit, the initial timing graph having a plurality of nodes corresponding to arrival times of signals in the digital circuit and a plurality of directed edges corresponding to propagate segments in the digital circuit, those of the edges directed into a given node being referred to as fan-ins for that node and being connected to associated fan-in nodes, those of the edges directed out of the given node being referred to as fan-outs for that node and being connected to associated fan-out nodes, said method comprising the steps of:

(a) examining a first group of the nodes including at least a first one of the nodes in the initial timing graph to determine if every node of said first group is pruneable;
 (b) pruning said first group by pruning every node of said first group if every node of said first group is pruneable, and if said pruning would be beneficial; and
 (c) repeating steps (a) and (b) for a substantial number of additional groups including at least additional ones of the nodes to create a pruned timing graph having enhanced qualities with respect to the initial timing graph, said enhanced qualities comprising at least one of numerical qualities and compactness.

2. The method of claim 1, further comprising the additional step of:

(d) generating a plurality of constraints corresponding to said pruned timing graph, said plurality of constraints being formulated for use in the static optimization of the digital circuit.

3. The method of claim 2, wherein:

said first group of the nodes includes only said first one of the nodes;

said additional groups each include only a single additional one of the nodes;

step (a) comprises:

determining whether said first one of the nodes appears in a constraint not represented by the propagate segments;

classifying said first one of the nodes as pruneable if said first one of the nodes does not appear in a constraint not represented by the propagate segements; and classifying said first one of the nodes as non-pruneable if said first one of the nodes does appear in a constraint not represented by the propagate segements;

in step (b), said pruning comprises removing said first one of the nodes and replacing said first one of the nodes with new directed edges connecting each one of the fan-in nodes for the first one of the nodes to each one of the fan-out nodes for the first one of the nodes; and in step (c), said repeating for a substantial number of additional groups comprises repeating for substantially all of the additional groups.

4. The method of claim 3, wherein step (b) comprises determining whether said pruning would be beneficial on the basis of at least one of reduced size, reduced redundancy, and reduced degeneracy as compared to a prior result without said pruning.

5. The method of claim 4, wherein step (b) comprises determining whether said pruning would be beneficial at least on the basis of reduced size, said reduced size being determined by a comparison of the number of nodes and the number of directed edges before said pruning with the number of nodes and the number of directed edges after said pruning.

6. The method of claim 5, wherein m is defined as the number of fan-in nodes for a given one of the nodes and n is defined as the number of fan-out nodes for said given one of the nodes, and wherein said determining on the basis of reduced size is implemented by pruning when the inequality $2\,mn \leq 2(m+n)+2$ is satisfied.

7. The method of claim 5, wherein size is defined by adding the number of nodes multiplied by a first weight factor and the number of directed edges multiplied by a second weight factor.

8. The method of claim 7, wherein said first and second weight factors are equal.

9. The method of claim 7, wherein said first and second weight factors are unequal.

10. The method of claim 7, wherein:

a gain from pruning is defined as a reduction in said size; and step (c) is initially performed only where said gain is at least equal to a first test value;

further comprising the additional steps of:

defining a second test value which is less than said first test value; and repeating steps (a)–(c) after step (c) is initially performed, where said gain is at least equal to said second test value;

whereby substantially all available gains which are at least equal to said first test value can be obtained before attempting to obtain said gains which are at least equal to said second test value.

11. The method of claim 10, further comprising the additional steps of:

defining a third test value which is equal to zero and which is less than said first test value and said second test value; and repeating steps (a)–(c) after previous repetitions thereof, when said gain is at least equal to zero;

whereby at least one of redundancy and degeneracy is, on average, reduced with a substantial degree of probability.

12. The method of claim 3, wherein step (d) comprises generating timing constraints associated with said new directed edges from step (b), said timing constraints including a summation of corresponding block delays, whereby said corresponding block delays are effectively replaced by path delays associated with said new directed edges.

13. The method of claim 1, wherein there is at least one multi-node group including at least one of:

said first group of the nodes; and at least one of said additional groups;

said multi-node group including at least two nodes.

14. The method of claim 13, wherein:

step (a) comprises:

determining whether each node in said first group appears in a constraint not represented by the propagate segments;

classifying a given node as pruneable if it does not appear in a constraint not represented by the propagate segments and as non-pruneable if it does appear in a constraint not represented by the propagate segments; and classifying said first group as pruneable if every node therein is pruneable;

in step (b), said pruning comprises:

identifying fan-in nodes for said first group;

identifying fan-out nodes for said first group;

identifying all paths through a prior timing graph from each of said fan-in nodes for said first group to each of said fan-out nodes for said first group;

removing pruned nodes;

replacing prior edges in the prior timing graph with one new edge for each path identified in said step of identifying all paths; and formulating constraints associated with said new edges; and in step (c), said repeating for a substantial number of additional groups comprises repeating for substantially all of the additional groups.

15. A method of restating an initial statement of a circuit optimization problem for static optimization of a digital circuit, the problem statement having a plurality of arrival times of signals in the digital circuit and a plurality of constraints, said method comprising the steps of:

(a) examining all those of the constraints in which at least a first group of the arrival times occur to determine if said constraints in which said first group of arrival times occur can be algebraically manipulated in a manner corresponding to pruning of said first group of arrival times;

(b) manipulating said constraints in which said first group of arrival times occur if said constraints in which said first group of arrival times occur can be so manipulated as to prune said first group of arrival times, and if said manipulation would be beneficial; and (c) repeating steps (a) and (b) for a substantial number of additional arrival time groups so as to create a pruned restatement of the optimization problem having enhanced qualities with respect to the initial statement of the optimization problem, said enhanced qualities comprising at least one of numerical qualities and compactness.

16. The method of claim 15, wherein:
said first group of arrival times includes only a single arrival time;
said additional arrival time groups each include only a single additional arrival time;
step (a) comprises:
  determining whether said single arrival time included in said first group appears nonlinearly in any constraint;
  classifying said single arrival time included in said first group as pruneable if said single arrival time included in said first group does not appear nonlinearly in any constraint; and
  classifying said single arrival time included in said first group as non-pruneable if said single arrival time included in said first group does appear nonlinearly in any constraint;
in step (b), said manipulating comprises replacing said constraints in which said first group of arrival times occur with a second, equivalent set of constraints, derived by taking linear combinations of the original constraints, wherein pruned arrival times have been eliminated; and
in step (c), said repeating for a substantial number of additional arrival time groups comprises repeating for substantially all of the additional arrival time groups.

17. The method of claim 16, wherein step (b) comprises determining whether said manipulation would be beneficial on the basis of at least one of reduced size, reduced redundancy, and reduced degeneracy as compared to a most previous problem statement without said manipulation.

18. The method of claim 17, wherein step (b) comprises determining whether said manipulation would be beneficial at least on the basis of reduced size, said reduced size being determined by a comparison of the number of arrival times and the number of constraints before said manipulation with the number of arrival times and the number of constraints after said manipulation.

19. The method of claim 18, wherein m is defined as the number of fan-in arrival times for a given one of the arrival times and n is defined as the number of fan-out arrival times for said given one of the arrival times, and wherein said determining on the basis of reduced size is implemented by manipulating when the inequality $2\ mn \leq 2(m+n)+2$ is satisfied.

20. The method of claim 18, wherein size is defined by adding the number of arrival times multiplied by a first weight factor and the number of constraints multiplied by a second weight factor.

21. The method of claim 20, wherein said first and second weight factors are equal.

22. The method of claim 20, wherein said first and second weight factors are unequal.

23. The method of claim 20, wherein:
a gain from manipulation is defined as a reduction in said size; and
step (c) is initially performed only where said gain is at least equal to a first test value;
further comprising the additional steps of:
  defining a second test value which is less than said first test value; and
  repeating steps (a)–(c) after step (c) is initially performed, where said gain is at least equal to said second test value;
  whereby substantially all available gains which are at least equal to said first test value can be obtained before attempting to obtain said gains which are at least equal to said second test value.

24. The method of claim 23, further comprising the additional steps of:
defining a third test value which is equal to zero and which is less than said first test value and said second test value; and
repeating steps (a)–(c) after previous repetitions thereof, when said gain is at least equal to zero;
whereby at least one of redundancy and degeneracy is, on average, reduced with a substantial degree of probability.

25. The method of claim 15, wherein there is at least one multi-arrival time group including at least one of:
said first group of arrival times; and
at least one of said additional arrival time groups;
said multi-arrival time group including at least two arrival times.

26. The method of claim 25, wherein:
step (a) comprises:
  determining whether each arrival time in said first group appears nonlinearly in any constraint;
  classifying a given arrival time as pruneable if it does not appear nonlinearly in any constraint and as non-pruneable if it does appear nonlinearly in any constraint; and
  classifying said first group as pruneable if every arrival time therein is pruneable;
in step (b), said manipulation comprises replacing said constraints in which said first group of arrival times occur with a second, equivalent set of constraints wherein pruned arrival times have been eliminated; and
in step (c), said repeating for a substantial number of additional arrival time groups comprises repeating for substantially all of the additional arrival time groups.

27. A method for static optimization of a digital circuit, said method comprising the steps of:
(a) creating a description of the digital circuit;
(b) creating an initial timing graph based on the circuit description of the digital circuit, the initial timing graph having a plurality of nodes corresponding to arrival times of signals in the digital circuit and a plurality of directed edges corresponding to propagate segments in the digital circuit, those of the edges directed into a given node being referred to as fan-ins for that node and being connected to associated fan-in nodes, those of the edges directed out of the given node being referred to as fan-outs for that node and being connected to associated fan-out nodes;
(c) pruning said initial timing graph, said pruning in turn comprising the steps of:
  (c-1) examining a first group of the nodes including at least a first one of the nodes in the initial timing graph to determine if every node of said first group is pruneable;
  (c-2) pruning said first group by pruning every node of said first group if every node of said first group is pruneable, and if said pruning would be beneficial; and
  (c-3) repeating steps (c-1) and (c-2) for a substantial number of additional groups including at least additional ones of the nodes to create a pruned timing graph having enhanced qualities with respect to the initial timing graph, said enhanced qualities comprising at least one of numerical qualities and compactness;

(d) listing timing constraints corresponding to the pruned graph;

(e) adding additional constraints and objective functions as necessary; and (f) optimizing the circuit based on the timing constraints corresponding to said pruned graph.

28. A digital circuit optimized by the method of claim 27.

29. A program storage device readable by machine, tangibly embodying a program of instructions executable by the machine to perform method steps for pruning an initial timing graph for static optimization of a digital circuit, the initial timing graph having, a plurality of nodes corresponding to arrival times of signals in the digital circuit and a plurality of directed edges corresponding to propagate segments in the digital circuit, those of the edges directed into a given node being referred to as fan-ins for that node and being connected to associated fan-in nodes, those of the edges directed out of the given node being referred to as fan-outs for that node and being connected to associated fan-out nodes, said method steps comprising:

(a) examining a first group of the nodes including at least a first one of the nodes in the initial timing graph to determine if every node of said first group is pruneable;

(b) pruning said first group by pruning every node of said first group if every node of said first group is pruneable, and if said pruning would be beneficial; and (c) repeating steps (a) and (b) for a substantial number of additional groups including at least additional ones of the nodes to create a pruned timing graph having enhanced qualities with respect to the initial timing graph, said enhanced qualities comprising at least one of numerical qualities and compactness.

30. A method for static optimization of a digital circuit, said method comprising the steps of:

(a) creating a description of the digital circuit;

(b) creating an initial problem statement having a plurality of arrival times of signals in the digital circuit and a plurality of constraints, said initial problem statement being based on said description of the digital circuit;

(c) restating said initial problem statement, said restating of said initial problem statement in turn comprising the steps of:

(c-1) examining all those of the constraints in which at least a first group of the arrival times occur to determine if said constraints in which said first group of arrival times occur can be algebraically manipulated in a manner corresponding to pruning of said first group of arrival times;

(c-2) manipulating said constraints in which said first group of arrival times occur if said constraints in which said first group of arrival times occur can be so manipulated as to prune said first group of arrival times, and if said manipulation would be beneficial; and (c-3) repeating steps (c-1) and (c-2) for a substantial number of additional arrival time groups so as to create a pruned restatement of the optimization problem having enhanced qualities with respect to the initial statement of the optimization problem, said enhanced qualities comprising at least one of numerical qualities and compactness;

(d) adding additional constraints and objective functions as necessary; and (e) optimizing the digital circuit based on said timing constraints corresponding to said restated problem statement.

31. A digital circuit optimized by the method of claim 30.

32. A program storage device readable by machine, tangibly embodying a program of instructions executable by the machine to perform method steps for restating an initial statement of a circuit optimization problem for static optimization of a digital circuit, the problem statement having a plurality of arrival times of signals in the digital circuit and a plurality of constraints, said method steps comprising:

(a) examining all those of the constraints in which at least a first group of the arrival times occur to determine if said constraints in which said first group of arrival times occur can be algebraically manipulated in a manner corresponding to pruning of said first group of arrival times;

(b) manipulating said constraints in which said first group of arrival times occur if said constraints in which said first group of arrival times occur can be so manipulated as to prune said first group of arrival times, and if said manipulation would be beneficial; and (c) repeating steps (a) and (b) for a substantial number of additional arrival time groups so as to create a pruned restatement of the optimization problem having enhanced qualities with respect to the initial statement of the optimization problem, said enhanced qualities comprising at least one of numerical qualities and compactness.

* * * * *